US011306387B2

(12) United States Patent
Stinnett

(10) Patent No.: US 11,306,387 B2
(45) Date of Patent: Apr. 19, 2022

(54) THERMAL PROTECTION SYSTEM FOR LIGHTWEIGHT HYPERSONIC MISSILE FIN

(71) Applicant: LOCKHEED MARTIN CORPORATION, Bethesda, MD (US)

(72) Inventor: Thomas Christian Stinnett, Dallas, TX (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 47 days.

(21) Appl. No.: 16/745,789

(22) Filed: Jan. 17, 2020

(65) Prior Publication Data
US 2021/0222284 A1 Jul. 22, 2021

(51) Int. Cl.
B32B 15/00 (2006.01)
C23C 14/06 (2006.01)
B64G 1/58 (2006.01)
C23C 14/02 (2006.01)
C23C 14/35 (2006.01)

(52) U.S. Cl.
CPC ............ *C23C 14/0641* (2013.01); *B64G 1/58* (2013.01); *C23C 14/021* (2013.01); *C23C 14/35* (2013.01)

(58) Field of Classification Search
None
See application file for complete search history.

(56) References Cited

U.S. PATENT DOCUMENTS 5,914,189 A * 6/1999 Hasz .................. C23C 28/36
428/335
6,033,768 A * 3/2000 Muenz ............... C23C 14/0641
204/192.1
2005/0079370 A1 * 4/2005 Corderman ......... C23C 28/3455
204/192.15
2011/0020081 A1 1/2011 Webb et al.
2019/0284686 A1 * 9/2019 Melnik ................ F01D 25/007

FOREIGN PATENT DOCUMENTS

| CN | 106702377 | 5/2017 |
| EP | 1431416 | 6/2004 |
| EP | 2236651 | 10/2020 |

OTHER PUBLICATIONS

Lewis et al., "The influence of the yttrium content on the structure and properties of Ti1-x-y-zAlxCryYzN PVD hard coatings", 1999, Surface and Coatings Technology, vol. 114, p. 187-199. (Year: 1999).*
Padture, "Advanced structural ceramics in aerospace propulsion", Aug. 2016, Nature Materials, vol. 15, p. 804-809. (Year: 2016).*
International Search Report, dated Apr. 28, 2021.

* cited by examiner

*Primary Examiner* — Seth Dumbris
*Assistant Examiner* — Kim S. Horger
(74) *Attorney, Agent, or Firm* — Terry M. Sanks, Esq.; Beusse Sanks, PLLC

(57) ABSTRACT

Thermal barrier coatings for substrates comprising titanium. The thermal barrier coating may include a bond layer, an insulating layer, and a sealant layer. The bond layer may include titanium, a titanium alloy, an intermetallic compound of titanium, and/or a titanium metal matrix composite. The bond layer may have a superlattice structure having a periodically repeating group of layers. Methods for producing the thermal barrier coatings and articles of manufacture employing the thermal barrier coatings.

15 Claims, 22 Drawing Sheets

X-axis is $W_{BC}$ = weight at the beginning of cruise in lbs.

X-axis is $W_F$ = fuel weight in lbs.

THERMAL PROTECTION SYSTEM FOR LIGHTWEIGHT HYPERSONIC MISSILE FIN

BACKGROUND

It is generally desirable to use light-weight structural materials in hypersonic missiles or vehicles, because light-weight structural materials help to optimize at least range, velocity, and fuel efficiency. Velocity and range, however, are constrained by material thermal limits. To compensate for the material thermal limits of various materials, thermal barrier coatings (TBC) may be employed.

For various hypersonic applications, titanium-based alloys would be preferable to higher density metallics, such as superalloys or steel alloys. Materials comprising titanium, such as titanium-based alloys, would be preferable due at least to their lighter weight, but titanium has poor high-temperature oxidation resistance. In fact, titanium alloys are generally unable to operate above 350-400° C. Therefore, a thermal barrier coating would be required for titanium-based alloys to operate at the elevated temperatures encountered during operation at hypersonic speeds. Prior to the present invention, no suitable TBC for a titanium-based alloy was available. Existing TBCs were designed to be used in conjunction with the compositions of various superalloys but not for materials comprising titanium, such as titanium alloys. Some existing TBC systems have been used on titanium structures, with limited success due to compatibility issues. For example, TBCs that have layers of Nickel-Cobalt-Chromium-Aluminum-Yttria (MCrAlY, in which M is Ni—Co) with Yttria stabilized Zirconia (YSZ) layers are commonly found and used for components such as compressor blades and/or turbine blades.

The MCrAlY/YSZ based TBC systems were originally design and developed for superalloy materials, such as various commercially available alloys like INCONEL® 718, HASTELLOY®, HAYNES®, etc. These materials have entirely different thermophysical and chemical properties with respect to titanium alloys and the compatibility between MCrAlY and titanium alloy is very poor. Long-term operations using these TBC with titanium-based alloys are unlikely to be successful.

For at least these reasons, material solutions are needed for a TBC having good compatibility with substrates comprising titanium. Use of such substrates would allow for increased range, velocity, and maneuverability. Such TBCs would be useful not only for missile fins, but also for a variety of future re-usable hypersonic air vehicles.

BRIEF SUMMARY

Various embodiments relate to a thermal barrier coating for a substrate, the thermal barrier coating may include a bond layer, an insulating layer, and a sealant layer. The substrate may include titanium, a titanium alloy, an inter-metallic compound of titanium, a metal matrix composite comprising titanium, and combinations thereof. The bond layer may include at least one selected from the group including titanium, a titanium alloy, an intermetallic compound of titanium, a metal matrix composite comprising titanium, and combinations thereof. The bond layer may have a superlattice structure, comprising a periodically repeating group of layers. The periodically repeating group of layers may include at least a first layer and a second layer (a bilayer). The first layer includes a first material and the second layer may include a second material that is different from the first material. The first material and the second material are independently selected from titanium, a titanium alloy, an intermetallic compound of titanium, a metal matrix composite comprising titanium, and combinations thereof. For example, the first material and the second material are independently selected from the group consisting of a Titanium Aluminum Niobium alloy (TiAlNb), a Titanium Aluminum Niobium Nitride alloy (TiAlNbN), a Titanium Aluminum Nitride (TiAlN), an Aluminum Titanium Nitride (AlTiN), a Titanium Nitride (TiN), a Titanium Aluminide (TiAl), and combinations thereof. Each group of layers in the periodically repeating group of layers may have a thickness of about 30 nm.

The insulating layer may be disposed on the bond layer, may include from about 7 to about 8 percent by weight of Yttria stabilized Zirconia (YSZ), and may have a thickness of about 30 μm.

The sealant layer may be disposed on the insulating layer, may include hexagonal boron nitride (hBN) and/or aluminum nitride (AlN), and may have a thickness less than about 500 nm.

Various embodiments relate to articles of manufacture that include a substrate and a thermal barrier coating according to various embodiments disposed thereon. The substrate may be a component of a hypersonic aerospace device, such as for example, a hypersonic missile fin.

Various embodiments relate to a method for producing such article of manufacture comprising a substrate and a thermal barrier coating disposed thereon. The method may include depositing a superlattice structure comprising a periodically repeating group of layers onto the substrate to form the bond layer. The method may also include etching the substrate prior to depositing the superlattice structure. The method may also include implanting ions of at least the first material into the substrate. The method may also include depositing at least one layer of YSZ onto the bond layer to form the insulating layer. The method may also include depositing hexagonal boron nitride (hBN) and/or aluminum nitride (AlN) onto the insulating layer to form the sealant layer.

These and other features, aspects, and advantages of various embodiments will become better understood with reference to the following description, figures, and claims.

BRIEF DESCRIPTION OF THE FIGURES

Many aspects of this disclosure can be better understood with reference to the following figures, in which.

Figure 1:
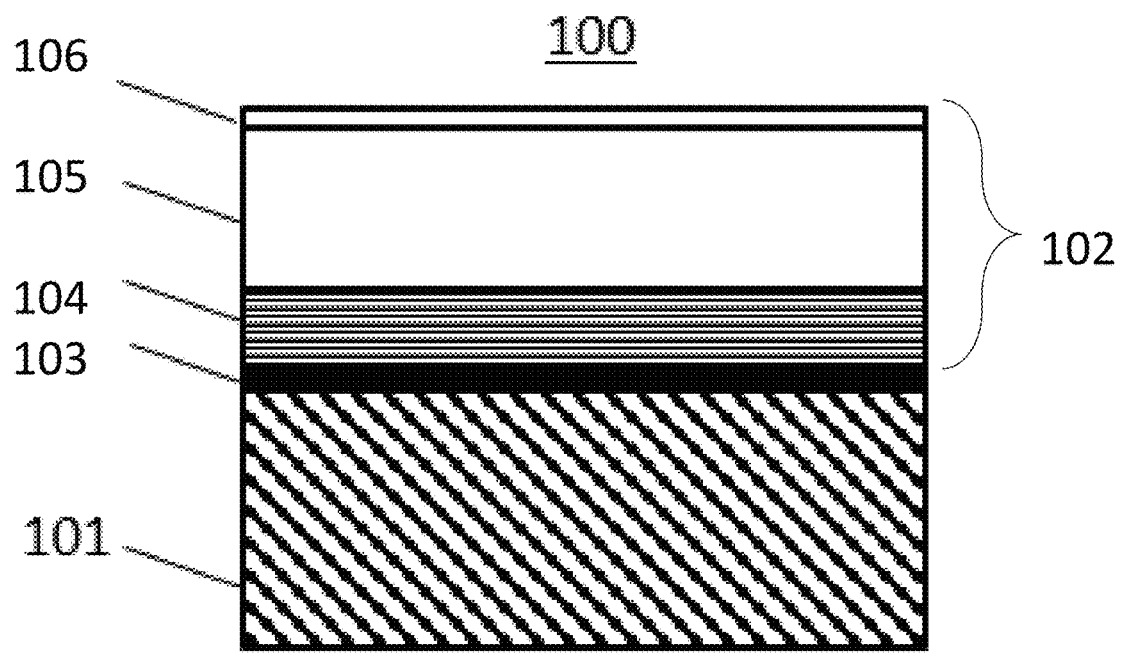
FIG. 1 is an example according to various embodiments illustrating an article of manufacture or a system comprising a substrate and a thermal barrier coating disposed thereon.

It should be understood that the various embodiments are not limited to the examples illustrated in the figures.

DETAILED DESCRIPTION

Introduction and Definitions

Various embodiments may be understood more readily by reference to the following detailed description. Unless defined otherwise, all technical and scientific terms used herein have the same meaning as commonly understood by one of ordinary skill in the art to which this disclosure belongs.

As used herein, the term "standard temperature and pressure" generally refers to 25° C. and 1 atmosphere. Standard temperature and pressure may also be referred to as "ambient conditions." Unless indicated otherwise, parts are by weight, temperature is in ° C., and pressure is at or near atmospheric. The terms "elevated temperatures" or "high-temperatures" generally refer to temperatures of at least 100° C.

The term "mol percent" or "mole percent" generally refers to the percentage that the moles of a particular component are of the total moles that are in a mixture. The sum of the mole fractions for each component in a solution is equal to 1.

It is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by prior disclosure. Further, the dates of publication provided could be different from the actual publication dates that may need to be independently confirmed.

Unless otherwise indicated, the present disclosure is not limited to particular materials, reagents, reaction materials, manufacturing processes, or the like, as such can vary. It is also to be understood that the terminology used herein is for purposes of describing particular embodiments only and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

The examples and embodiments described herein are for illustrative purposes only and various modifications or changes in light thereof will be suggested to persons skilled in the art and are to be included within the spirit and purview of this application. Many variations and modifications may be made to the above-described embodiment(s) of the disclosure without departing substantially from the spirit and principles of the disclosure. All such modifications and variations are intended to be included herein within the scope of this disclosure.

General Discussion

Various embodiments relate to a thermal barrier coating (TBC) that may be disposed on a substrate. As will be discussed in greater detail, the substrate may include titanium, a titanium alloy, an intermetallic compound of titanium, or a metal matrix composite comprising titanium. The TBC may provide significantly improved oxidation resistance allowing the substrate to be used for higher temperature applications, including but not limited to hypersonic aerospace applications. For example, according to various embodiments, the TBC may have an oxidation resistance such that it exhibits less than about 0.2 mg/cm$^2$ weight gain over about 70 hours exposure to a temperature of about 600 degrees Celsius. Similarly, according to various embodiments, the TBC may have an oxidation resistance such that it exhibits less than 1 mg/cm$^2$ weight gain over 70 hours exposure to a temperature of about 800 degrees Celsius.

Broadly speaking, according to various embodiments, the TBC may have an oxidation resistance such that it exhibits a weight gain due to oxidation when exposed to a temperature for a time duration. The weight gain may be within a range having a lower limit and/or an upper limit. The range may include or exclude the lower limit and/or the upper limit. The lower limit and/or upper limit may be selected from about 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, and 2 mg/cm$^2$. Any range formed from any lower limit, any upper limit, or any combination of a lower limit and an upper limit includes all values therebetween. For example, according to certain embodiments, the weight gain may be from about 0.1 mg/cm$^2$ to about 2 mg/cm$^2$, or any combination of lower limits and upper limits described. The temperature may be within a range having a lower limit and/or an upper limit. The range may include or exclude the lower limit and/or the upper limit. The lower limit and/or upper limit may be selected from about 500, 525, 550, 575, 600, 625, 650, 675, 700, 725, 750, 775, 800, 825, 850, 875, 900, 925, 950, 975, and 1000 degrees Celsius. Any range formed from any lower limit, any upper limit, or any combination of a lower limit and an upper limit includes all values therebetween. For example, according to certain embodiments, the temperature may be from about 500 to about 1000 degrees Celsius, or any combination of lower limits and upper limits described. The temperature may be from about 500 to about 1000 degrees Celsius. The time duration may be within a range having a lower limit and/or an upper limit. The range may include or exclude the lower limit and/or the upper limit. The lower limit and/or upper limit may be selected from about 50, 55, 60, 65, 70, 75, 80, 85, 90, 95, and 100 hours. Any range formed from any lower limit, any upper limit, or any combination of a lower limit and an upper limit includes all values therebetween. For example, according to certain embodiments, the duration may be from about 50 to about 100 hours, or any combination of lower limits and upper limits described. Any combination of weight gains, temperatures, and durations described is contemplated. As an overall example, according to various embodiments, the TBC may have an oxidation resistance such that it exhibits a weight gain of from about 0.1 to 2 mg/cm$^2$ when exposed to a temperature of from 500 to 1000 degrees Celsius for a duration of from 50 to 100 hours.

FIG. 1 is an example according to various embodiments illustrating an article of manufacture or a system 100 comprising a substrate 101 and a thermal barrier coating 102 disposed thereon. The substrate 101 may include a modified substrate interface region 103. The thermal barrier coating 102 may include a plurality of layers or regions. Each region will be discussed in detail. The plurality of layers or regions may include a bond layer 104, an insulating layer 105, and a sealant layer 106.

Figure 2:
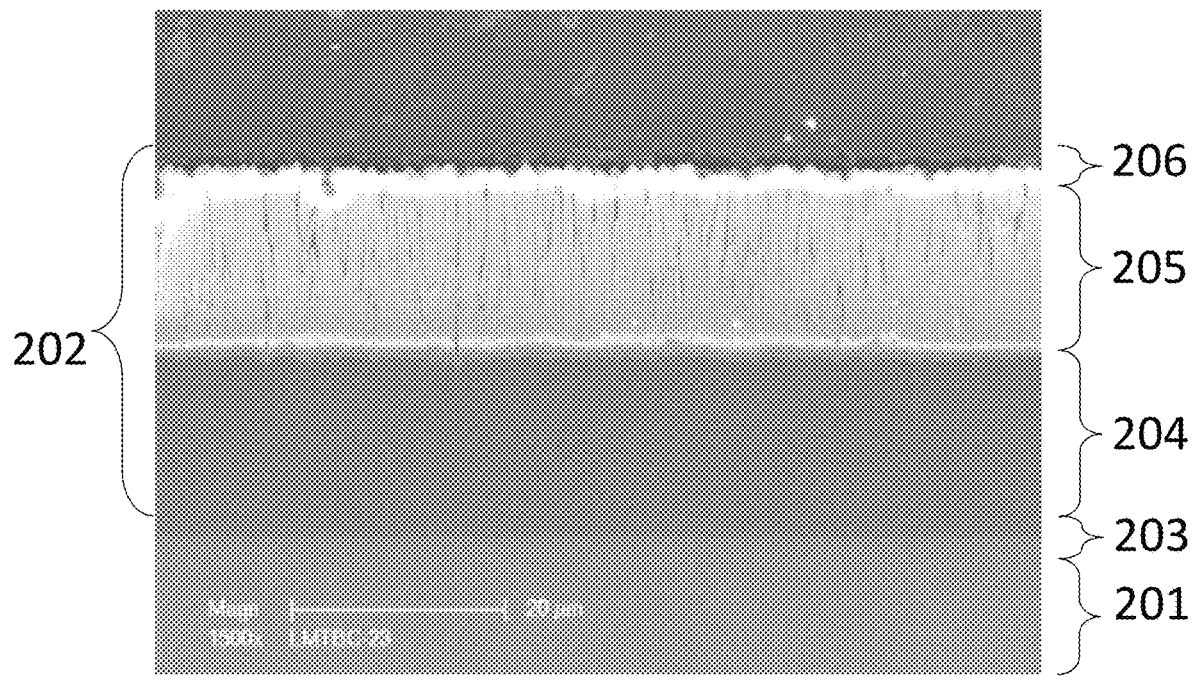
FIG. 2 is an example according to various embodiments illustrating a Scanning Electron Micrograph (SEM) image of a substrate and a thermal barrier coating disposed thereon.

FIG. 2 is an example according to various embodiments illustrating an SEM image of a system 200. The system 200 is an example of a system 100 as illustrated in FIG. 1. The system 200 comprises a substrate 201 and a thermal barrier coating 202 disposed thereon. The substrate 201 includes a modified substrate interface region 203. The thermal barrier coating 202 includes a plurality of layers or regions. The plurality of layers or regions includes a bond layer 204, an insulating layer 205, and a sealant layer 206.

Substrate

As used herein, the term "substrate" refers to any component or material onto which a thermal barrier coating may be deposited. Referring again to FIG. 1, the substrate 101 may comprise titanium, a titanium alloy, an intermetallic compound of titanium, or a metal matrix composite comprising titanium. For example, the substrate 101 may comprise a titanium-based alloy, including but not limited to conventional titanium alloy types, such as alpha alloys (e.g. Ti-5Al-2Sn-ELI, Ti-8Al-1Mo-1V, etc.), near-alpha alloys (e.g. Ti-6Al-2Sn-4Zr-2Mo, Ti-5Al-5Sn-2Zr-2Mo, etc.), alpha-beta alloys (e.g. Ti-6Al-4V, Ti-6Al-4V-ELI, Ti-6Al-6V-2Sn, Ti-6Al-7Nb, etc.), and metastable beta alloys (Ti-10V-2Fe-3Al, Ti-29Nb-13Ta-4.6Z, Ti-13V-11Cr-3Al, Ti-8Mo-8V-2Fe-3Al, Ti-15Mo-3Nb-3Al-0.2Si, etc.). The substrate 101 may also comprise an intermetallic compound of titanium, such as titanium aluminides (TiAl), including but not limited to gamma TiAl, alpha 2-Ti3Al and TiAl3 intermetallics. The substrate may also comprise a titanium metal matrix composite, where a titanium matrix phase is used in combination with a dispersed phase, such as silicon carbide (SiC) or boron-based reinforcements.

The substrate may include a modified substrate interface region 103. The modified substrate interface region 103 may comprise a modified portion of substrate 101. The modified portion of substrate 101 may be a layer of substrate 101 that has been etched and/or intermixed with ions from bond layer 104. The modified substrate interface region 103 may, therefore, be referred to as an etched portion of the substrate or an intermix layer of the substrate. More specifically, the modified portion of substrate 101 may be modified via plasma etching using Plasma Enhanced Magnetron Sputtering (PEMS). The plasma etching may be useful to remove any residual oxide layers, organics and/or other impurities on the surface of the substrate. Additionally or alternatively, High Power Impulse Magnetron Sputtering (HiPIMS) discharge may be used for surface etching and/or ion implantation. For example, the modified portion of substrate 101 may be etched via HiPIMS. Ions of bond layer 104 may also be implanted into the modified portion of substrate 101 via HiPIMS, such that the modified substrate interface region includes an intermix interface. In other words, metal ion intermixing in the modified substrate interface region 103 may result in a gradual change of the composition from pure adhesion layer to pure bond coat, a composition of substrate 101 to a composition of bond layer 104. Such an intermix interface may be useful for providing a high bonding strength, better than HF1 adhesion, between modified substrate layer 103 and bond layer 104.

Bond Layer

Still referring to FIG. 1, the TBC 102 may further include a bond layer 104. As used herein, the term "bond layer" or "bond coat" refers to a single or multi-layered component of a thermal barrier coating that is the first layer applied to a substrate. The bond layer is a critical component of a thermal barrier coating, because it facilitates adhesion between the other layers and the substrate. The bond layers according to various embodiments also provide a variety of useful structural and thermal benefits which will be described in detail.

The bond layer 104 may include a single layer or a multilayered system. The multilayered system may have a plurality of layers in a superlattice structure. As used herein, the term "superlattice" refers to a periodic structure of layers of a plurality of materials. Typically, the thickness of at least one layer is on the order of several nanometers. According to various embodiments, high-density interfaces may be present due to the superlattice structure, resulting in phonon interface scattering, thereby lowering the bulk thermal conductivity. According to various embodiments, the bond layer may have a bulk thermal conductivity within a range having a lower limit and/or an upper limit. The range may include or exclude the lower limit and/or the upper limit. The lower limit and/or upper limit may be selected from about 0.25, 0.5, 0.75, 1, 1.25, 1.5, 1.75, 2, 2.25, 2.5, 2.75, 3, 3.25, 3.5, 3.75, 4, 4.25, 4.5, 4.75, 5, 5.25, 5.5, 5.75, 6, 6.25, 6.5, 6.75, 7, 7.25, 7.5, 7.75, 8, 8.25, 8.5, 8.75, 9, 9.25, 9.5, 9.75, 10, 15, 20, 25, 30, 35, 40, 45, and 50 W/mK. Any range formed from any lower limit, any upper limit, or any combination of a lower limit and an upper limit includes all values therebetween. For example, according to certain embodiments, the bond layer may have a bulk thermal conductivity of less than about 5 W/mK, or any combination of lower limits and upper limits described.

The multilayered system may include any number of layers and the periodic structure of layers may include any number of layers. For example, the periodic structure of layers may include a sequence of 2, 3, 4, 5, 6, 7, 8, 9, 10, 11, 12 or any number of layers and the periodic structure of layers may be repeated any number of times. According to various embodiments the periodic structure may be a repeating sequence of two layers, which may be referred to as a "bilayer." See FIG. 3B for an example of a periodic bilayered structure. Each bilayer may have a thickness within a range having a lower limit and/or an upper limit. The range may include or exclude the lower limit and/or the upper limit. The lower limit and/or upper limit may be selected from about 0.1, 1, 2, 3, 4, 5, 6, 7, 8, 9, 10, 11, 12, 13, 14, 15, 16, 17, 18, 19, 20, 21, 22, 23, 24, 25, 26, 27, 28, 29, and 30 nm. Any range formed from any lower limit, any upper limit, or any combination of a lower limit and an upper limit includes all values therebetween. For example, according to certain embodiments, each bilayer periodic structure may have a thickness of about 30 nanometers or less, or any combination of lower limits and upper limits described. The nanoscale thickness may take advantage of phonon scattering events at the interfaces to lower thermal conductivity in general for a broad band of phonon frequencies, but specific operational enhancement can be achieved at desired operating temperatures by taking advantage of phonon filtering due to large contrasting differences in vibrational spectra between ceramic layers (e.g. TiAlNbN) and metal layers (e.g. TiAlNb) at the desired phonon frequencies. The dissimilarity in spectra can assist in preventing the propagation of certain phonon frequency, thereby lowering thermal conductivities at specific operating temperatures.

Each layer in the periodic structure of layers may have a composition selected independently of other layers in the periodic structure layers. For example, each layer in the periodic structure of layers may have a composition that is selected with or without regard to the composition of any other layer or layers in the periodic structure of layers. The composition of any layer in the bond layer for a single layered system or a multilayered system may include titanium, a titanium alloy, an intermetallic compound of titanium, or a metal matrix composite comprising titanium. Variations of each of these materials include at least the variations described with respect to the substrate.

According to various embodiments, the composition of any layer in the bond layer for a single layered system or a multilayered system may include a Titanium Aluminum Niobium alloy (TiAlNb), a Titanium Aluminum Niobium Nitride alloy (TiAlNbN), a Titanium Aluminum Nitride (TiAlN), an Aluminum Titanium Nitride (AlTiN), a Titanium Nitride (TiN), a Titanium Aluminide (TiAl), or any combination or combinations thereof. Small amounts of additional elemental constituents may be added to the above materials systems for the purposes of phase stabilization, oxidation resistance, ductility enhancement, etc. Such constituents may include boron, chromium, molybdenum, silicon, vanadium, etc.

Titanium Aluminum Niobium alloy (TiAlNb) refers to an alloy formed via the addition of niobium to a binary titanium-aluminum alloy. The resulting alloy may have increased strength at temperatures up to 500° C.

Titanium Aluminum Niobium Nitride alloy (TiAlNbN) refers to an alloy formed via the addition of niobium nitride (NbN) to a binary titanium-aluminum alloy.

Titanium Aluminum Nitride (TiAlN) or Aluminum Titanium Nitride (AlTiN; for aluminum contents higher than 50%) refers to a group of metastable hard coatings including nitrogen and the metallic elements aluminum and titanium.

Titanium nitride (TiN; sometimes known as Tinite) is an extremely hard ceramic material.

Titanium aluminide (TiAl) has three major intermetallic compounds: gamma TiAl, alpha 2-Ti3Al and TiAl3. Among the three, gamma TiAl has received the most interest and applications. Gamma TiAl has excellent mechanical properties and oxidation and corrosion resistance at elevated temperatures (over 600 degrees Celsius), which makes it a possible replacement for traditional Ni based superalloy components in aircraft turbine engines.

Referring to FIG. 2, the bond layer 204 comprises a periodic bilayer having a first layer comprising TiN and a second layer comprising AN. The bond layer 204 has a thickness of about 18 μm.

The composition of the bond layer 104 may be designed for Coefficient of Thermal Expansion (CTE) matching between the bond layer 104 and the substrate 101, as well as for improved strain tolerance for thermal shock resistance. For example, better CTE matching between the substrate and bond coat may be achieved depending on the phase of TiAl and amount used. If the substrate is a conventional titanium-based alloy, such as alpha, alpha-beta, or metastable beta alloys, then it may be desirable to use a large fraction of alpha-2 TiAl phase due to better substrate compatibility. Whereas, a substrate with a large percentage of aluminum (>30 at. %) may require a large fraction of the gamma TiAl phase for CTE matching. The bond layer 104 may also serve as a secondary thermally insulating layer and oxidation resistance layer. A first order approximation of CTE may be established by the rules of mixtures for composites $\alpha c = Vp$ (CTE of reinforcement)+$Vm$ (CTE of matrix).

The bond layers described according to various embodiments exhibit significantly improved CTE matching. The CTE matching between the bond layer and the substrate may be improved. The CTE mismatch between prior MCrAlY coatings and titanium alloys are significant and may be about $5 \times 10^{-6}$ m° C. The bond layers described according to various embodiments may have multilayers forming composite structures that may reduce the CTE mismatch between the bond layer and the substrate between $1 \times 10^{-6}$ m° C.-$1.5 \times 10^{-6}$ m° C. Similarly, the CTE matching between the bond layer and an insulating layer may be improved. The CTE mismatch between prior art MCrAlY layers and the insulating layers described herein would be about $3.5 \times 10^{6}$ m° C. The bond layers described according to various embodiments may reduce the CTE mismatch between the bond layer and the insulating layer between $1 \times 10^{-6}$ m° C.-$1.5 \times 10^{-6}$ m° C.

Multilayered bond layers described according to various embodiments exhibit better oxidation resistance compared to TiAlN and TiAl monolayers by densely multilayering (900° C. to 1,100° C.).

As demonstrated according to various embodiments described herein, the addition of TiAl interlayers can reduce elastic modulus by 100 GPa or more and improve adhesion, thereby providing improved toughness and thermal shock resistance.

Figure 3A:
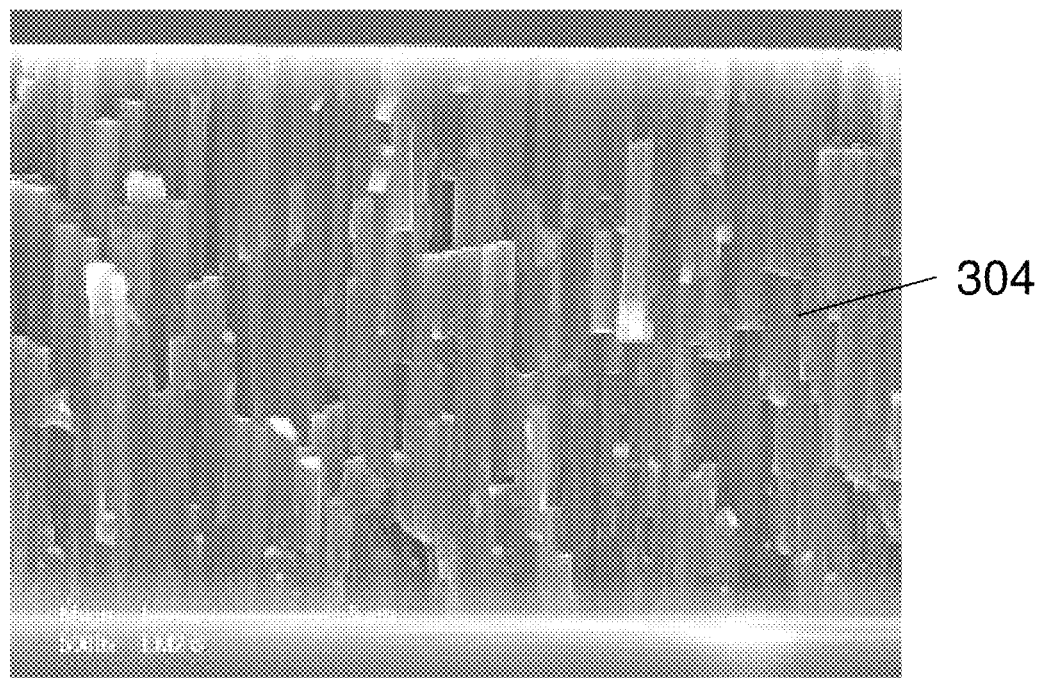
FIG. 3A is an example according to various embodiments illustrating an SEM image of a multilayered bond layer.

FIG. 3A is an example according to various embodiments illustrating an SEM image of a multilayered TiAlNbN/TiAlNb bond layer 304 in a superlattice structure. Bond layer 304 is an example of a bond layer 104 as illustrated in FIG. 1. The bond layer 304 comprises a sputtered TiAlN/TiAl superlattice showing dense, fine grain microstructure.

Figure 3B:
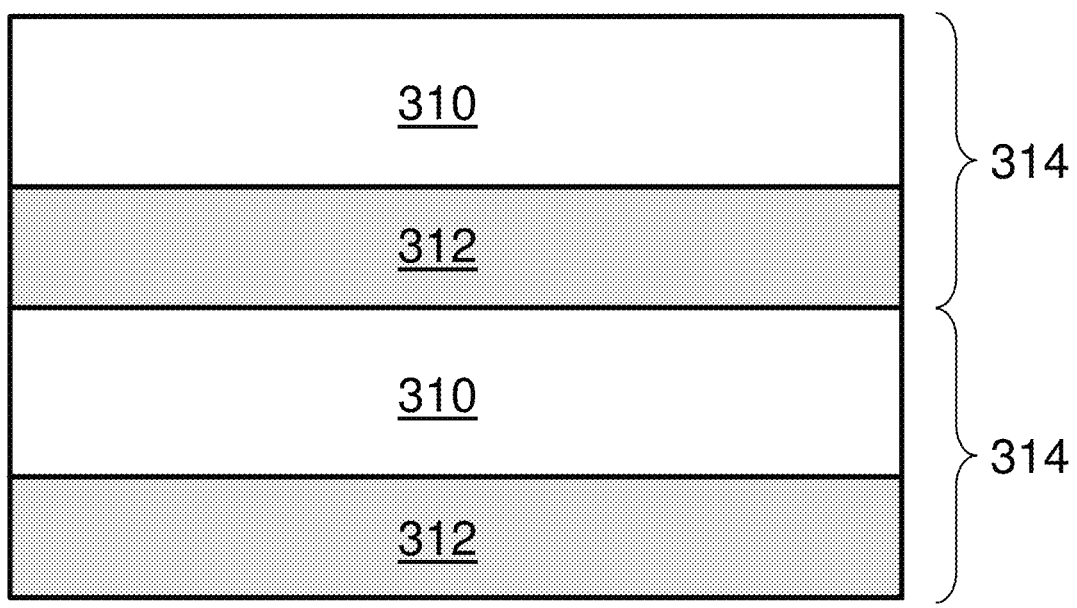
FIG. 3B is an example according to various embodiments illustrating a schematic diagram of a multilayered bond layer.

FIG. 3B is an example according to various embodiments illustrating a schematic diagram of a multilayered bond layer 304. The multilayered bond layer 304 may include a periodic bilayered structure comprising a plurality of bilayers 314. Each bilayer 314 may include a first layer 310 and a second layer. Each first layer 310 may comprise a first composition and each second layer 312 may comprise a second composition. As already discussed, the first composition may be, for example, a TiAlNbN alloy and the second composition may be, for example, a TiAlNb alloy. The first layers 310 and the second layers 312 may be present in a dense, less than 100 nm bilayer, superlattice structure.

Figure 3C:
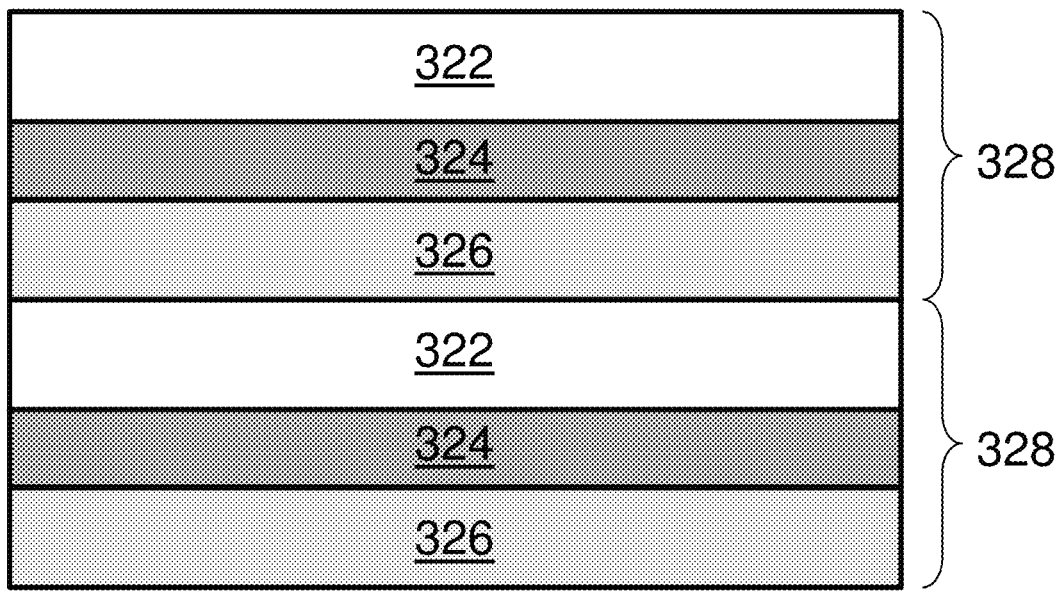
FIG. 3C is an example according to various embodiments illustrating a schematic diagram of a multilayered bond layer.

As already discussed, the invention is not limited to a bilayered structure. The periodic structure may include repeating sequences comprising any number of layers. FIG. 3C is an example according to various embodiments illustrating a schematic diagram of a multilayered bond layer 304 having a periodic trilayered structure comprising a plurality of trilayers 328. Each trilayer 328 may include a first layer 322, a second layer 324, and a third layer 326. Each first layer 322 may comprise a first composition, each second layer 324 may include a second composition, and each third layer 326 may include a third composition.

According to various embodiments the alpha-2 Ti3Al phase intermetallic may be used within the bond layer architecture rather than the gamma TiAl phase for conventional titanium-based alloys (i.e., near alpha, alpha, alpha-beta, and metastable beta grades). The alpha-2 phase may be desirable for better CTE matching and increase ductility. The CTE of Ti-6Al-4V alloy at 400 C is $9.4 \times 10^{-6} K^{-1}$, the CTE of gamma TiAl is $15 \times 10^{-6} K^{-1}$, and the CTE of alpha-2 is $10 \times 10^{-6} K^{-1}$ The room temperature ductility of alpha-2 is between 2-4%, whereas gamma is between 1-3%. According to various embodiments, the increase in ductility may allow for improved strain tolerance during both processing conditions and operating conditions. This may result in overall better longevity of the TBC. Moreover, according to various embodiments, the addition of niobium as an alloy additive may be desirable due to its improvement in both oxidation resistance as well as improve ductility. Conversely, according to various embodiments gamma TiAl phase intermetallic may be employed within the bond coat architecture whenever the substrate contains a large volume fraction of gamma phase as an intermetallic compound. This is the case when titanium is alloyed with more than 30 at. % of aluminum and/or with gamma phase promoters.

Insulating Layer

Referring again to FIG. 1, the TBC 102 may further include an insulating layer 105. As used herein, the term "insulating layer" or "top coat" refers to a single or multi-layered component of a thermal barrier coating. The insulating layer is typically deposited on top of a bond coat.

The insulating layer 105 may comprise from about 7 to about 8 percent by weight of Yttria stabilized Zirconia (YSZ). The YSZ may have a columnar microstructure for thermal shock resistance.

FIG. 2 shows an insulating layer 205 comprising YSZ having a thickness of about 20 µm. According to various embodiments, the insulating layer may have a thickness within a range having a lower limit and/or an upper limit. The range may include or exclude the lower limit and/or the upper limit. The lower limit and/or upper limit may be selected from about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, and 50 µm. Any range formed from any lower limit, any upper limit, or any combination of a lower limit and an upper limit includes all values therebetween. For example, according to certain embodiments, the insulating layer may have a thickness of from about 1 µm to about 50 µm, or any combination of lower limits and upper limits described.

Figure 4:
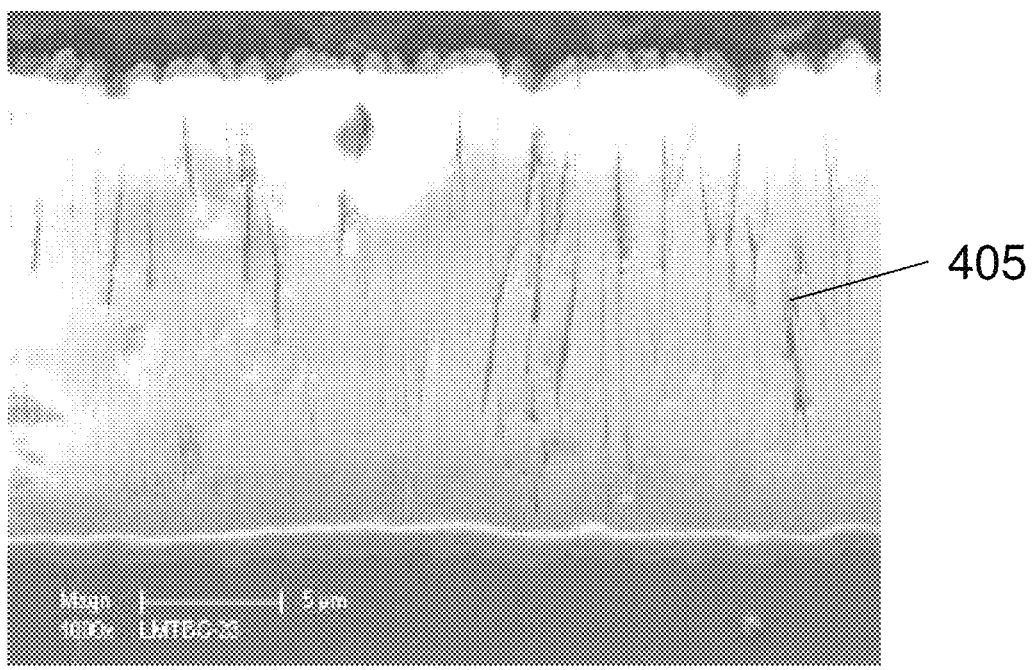
FIG. 4 is an example according to various embodiments illustrating an SEM image of an insulating layer.

FIG. 4 is an example according to various embodiments illustrating an SEM image of a YSZ insulating layer 405. Insulating layer 405 is an example of an insulating layer 105 as illustrated in FIG. 1. The insulating layer 405 comprises a magnetron sputtered YSZ coating showing a columnar microstructure.

According to various embodiments, the YSZ multilayered structure may provide a reduced thermal radiation transport by increasing the overall coating reflectivity. Electromagnetic (EM) reflectivity, particularly infrared range, may be increased for a desired wavelength by modulating the YSZ layer either periodically or variably. Periodicity may be used whenever a particular EM wavelength is desired to be reflected, whereas a broadband reflectance may be achieved by variable spacing the modulated layers. In general, the reflectance may be increased by tailoring the densities of alternating layers to create differing refractive indices, and/or by creating several through plane interfaces. The method of such may be achieved by varying the ion flux during deposition via shutter close/open loop cycle, reactive gas flow (e.g. oxygen), ionization fraction (e.g. during HiPIMS), or simply by incorporating an additional coating layer (e.g. $Al_2O_3$), during deposition using PVD.

Sealant Layer

Referring again to FIG. 1, the TBC 102 may further include a sealant layer 106. As used herein, the term "sealant layer" or "sealant coat" refers to a single or multi-layered component of a thermal barrier coating. The sealant layer is typically the outermost layer of the thermal barrier coating.

The sealant layer 106 may comprise hexagonal boron nitride (hBN) or aluminum nitride (AlN) used as conformal film to act as an oxygen diffusion barrier and as a low-friction surface. The sealant layer may have a thickness within a range having a lower limit and/or an upper limit. The range may include or exclude the lower limit and/or the upper limit. The lower limit and/or upper limit may be selected from about 10, 20, 30, 40, 50, 60, 70, 80, 90, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, 490, and 500 nm. Any range formed from any lower limit, any upper limit, or any combination of a lower limit and an upper limit includes all values therebetween. For example, according to certain embodiments, the sealant layer may have a thickness of less than about 500 nm, of from about 10 to about 500 nm, or any combination of lower limits and upper limits described. FIG. 2 includes a specific example of a sealant layer 206 comprising hBN, having a thickness of about 300 nm.

According to various embodiments an ultra-thin film of hBN in the range of 1-100 nm may be sufficient to provide high-temp oxidation resistance from 1000° C.-1,500° C.

The sealant layer may act as a low oxygen permeability sealant layer on top of porous YSZ top layer. I.e. the sealant layer may limit the amount of diffuse oxygen species by reducing diffusivity values lower than $1.0 \times 10^{-17}$ $m^2$/s within titanium alloys.

The sealant layer may also act as solid lubricant for low friction surface in both cryogenic and elevated temperature environments by reducing the coefficient of friction value to 0.1 between mating titanium counterbodies, i.e., tribopairs.

Figure 5:
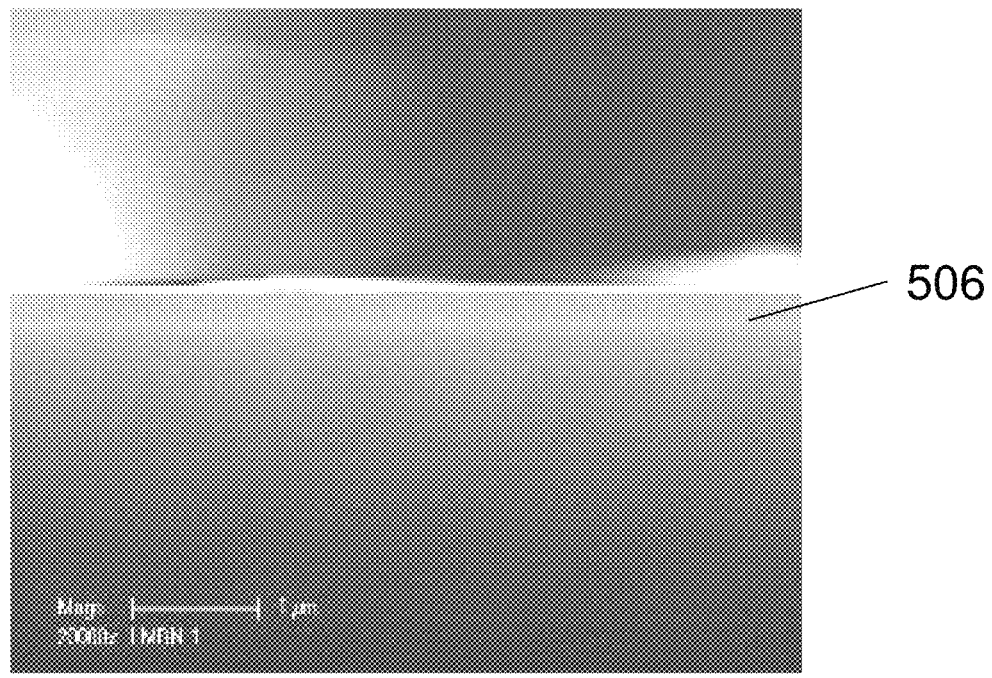
FIG. 5 is an example according to various embodiments illustrating an SEM image of a sealant layer.

FIG. 5 is an example according to various embodiments illustrating an SEM image of a sealant layer 506. Sealant layer 506 is an example of a sealant layer 106 as illustrated in FIG. 1. Sealant layer 506 illustrated in FIG. 5 comprises a plasma immersion ion deposited BN sealant layer. The sealant layer 506 may comprise hBN or AlN.

Boron nitride is a thermally and chemically resistant refractory compound of boron and nitrogen with the chemical formula BN. It exists in various crystalline forms that are isoelectronic to a similarly structured carbon lattice. The amorphous form of boron nitride (a-BN) is non-crystalline, lacking any long-distance regularity in the arrangement of its atoms. The most stable crystalline form is the hexagonal one, also called h-BN, α-BN, g-BN, and graphitic boron nitride. Cubic boron nitride (c-BN) has a crystal structure analogous to that of diamond. The wurtzite form of boron nitride (w-BN) has the same structure as lonsdaleite, a rare hexagonal polymorph of carbon.

Figure 6:
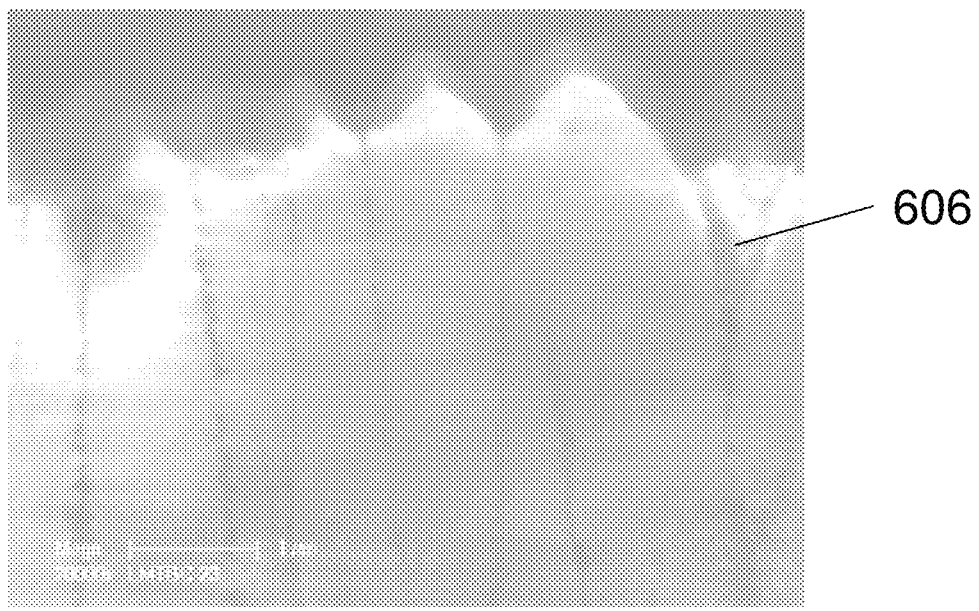
FIG. 6 is another example according to various embodiments illustrating an SEM image of a sealant layer.

FIG. 6 is another example according to various embodiments illustrating an SEM image of a sealant layer 606. Sealant layer 606 is an example of a sealant layer 106 as illustrated in FIG. 1.

Methods

The TBC system may be produced using one of the techniques within the Physical Vapor Deposition (PVD) family. Two common techniques are magnetron sputtering and Electron Beam PVD (EB-PVD). A combination of both techniques may be used, such as cleaning the substrate and depositing the multilayered bond layer using magnetron sputtering and depositing additional insulating layer, using EB-PVD. Moreover, a combination of sputtering techniques may also be used in depositing the whole TBC system.

Figure 7:
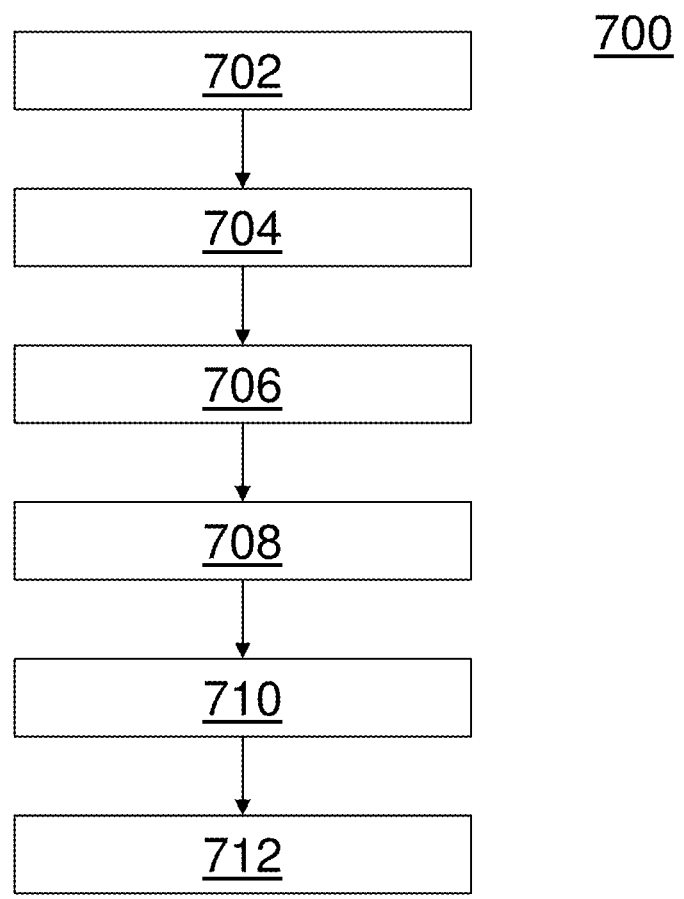
FIG. 7 is an example according to various embodiments illustrating a flow chart for depositing the inventive thermal barrier coating.

FIG. 7 is an example according to various embodiments illustrating a flow chart depicting a method 700 for producing thermal barrier coatings according to various embodiments.

The method 700 may include a step 702 of providing or producing a clean substrate. The substrate may be a substrate as described according to any embodiment described herein. As an example, High Power Impulse Magnetron Sputtering (HiPIMS) within a Plasma Enhanced Magnetron Sputtering (PEMS) environment may be employed. Such an approach may start by plasma cleaning the titanium-based alloy substrate using a combination of working gases, such as argon (Ar) and/or hydrogen (H), to remove residual oxide and impurities. The clean substrate should then be ready for depositing an adhesion layer.

The method 700 may further include an optional step 704 of modifying all or a portion of one or more surfaces of the substrate. According to various embodiments, the modification may be performed via plasma etching using Plasma Enhanced Magnetron Sputtering (PEMS).

The method 700 may further include an optional step 706 of implanting ions of a bond layer into at least a portion of one or more surfaces of the substrate. The ion implantation may be performed via High Power Impulse Magnetron Sputtering (HiPIMS) discharge. HiPIMS can be used to create an engineered intermix layer to enhance adhesion by implanting metal ions a few nanometers (<15 nm) within the substrate. The implanted metal ions can be from a pure titanium target, binary alloy target (e.g. Ti—Al), or even a ternary alloy target (e.g. Ti—Al—Nb) with varying atomic ratios.

The method 700 may further include a step 708 of depositing a bond layer onto the substrate. Depending on system configuration the multilayer structure of the bond layer may be produced in several ways. For example, if the system is limited to a single magnetron, then the multilayered structure can be produced by turning the nitrogen ($N_2$) reactive gas flow on-and-off using a single Ti—Al—Nb target, while leaving the Argon (Ar) on. While the $N_2$ gas is turned on the metal will react with the nitrogen and effectively produce a nitride layer, such as TiAlNbN. While the gas is turned off the metal will condensate onto the substrate free of any nitrides. If the system configuration allows for multiple magnetrons to be used, then the bond coat can be deposited using separate targets with the appropriate worktable rotation. Moreover, the addition of multiple magnetrons allows for transition from bond layer to insulating layer without the need to break vacuum to switch out target material.

The method 700 may further include a step 710 of depositing an insulating layer onto the substrate. The insulating layer, comprising, for example YSZ, may be reactively deposited by sputtering a zirconium-yttrium (Zr—Y) target that is preferably between 6-8 mol. %. The working gas mixture can be a combination of oxygen ($O_2$) and argon (Ar). It is desirable to use closed-loop control during reactive sputtering of the insulating layer and to optimize the $O_2$ partial pressure to increase deposition time. The benefit of using the PEMS environment as part of sputtering allows for the same chamber to be used to deposit a conformal coating, such as h-BN, using Plasma Immersion Ion Assisted Deposition (PIID) technique. The PIID technique is a version of Plasma Enhanced Chemical Vapor Deposition (PECVD). The chamber is pumped down to approx. $10^{-6}$ Torr and then backfilled with a Boron (B) precursor to approx. 10 millitorr. A negative voltage may be applied to the substrate and a plasma may be generated that dissociates the precursor gas and draws the ions onto the part.

The method 700 may further include a step 712 of depositing a sealant layer onto the substrate. The sealant layer may be deposited by any suitable deposition method, including those already discussed herein.

Exemplary Applications

Figure 8:
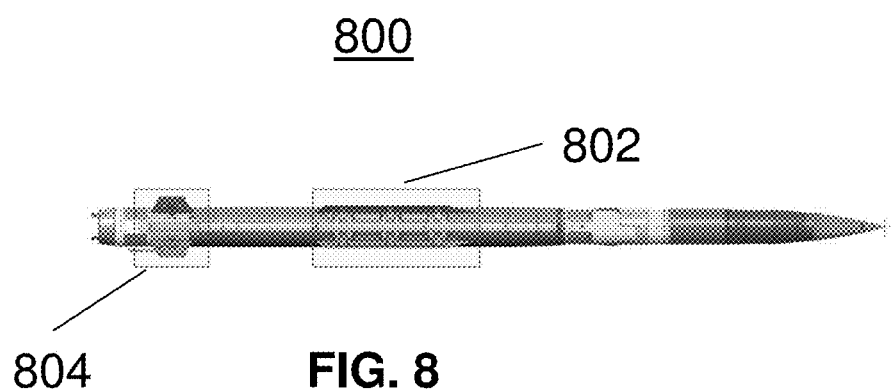
FIG. 8 is an example according to various embodiments illustrating a missile having a plurality of control surfaces and folding fins provided with the inventive thermal barrier coating.

FIG. 8 is an example according to various embodiments illustrating a missile 800 having a plurality of control surfaces 802 and folding fins 804 provided with the inventive thermal barrier coating. Each missile 800 may have multiple folding fins 804 and multiple control surfaces 802. For example, missile 800 includes four folding fins. The structure of the control surfaces 802 and/or the folding fins 804 may comprise titanium or a titanium alloy. A thermal barrier coating according to the various embodiments described herein may be deposited on the control surfaces 802 and/or on the folding finds 804. Various embodiments may be employed in association with a variety of hypersonic missile defense platforms, such as PAC-3MSE, Increment II or Valkyrie; a variety of hypersonic strike platforms, such as ARRW; as well as in future hypersonic reusable air vehicles. The specific missile 800 illustrated in FIG. 8 is a PAC-3 MSE Interceptor. In which case, the control surfaces 802 and fixed fins 804 may be comprised of Ti-6Al-4V. Prior surface treatments did not provide protection for high heat fluxes or erosion resistance for adverse natural environments. Most Ti-6Al-4V alloys are limited to temperatures ranges of 350-400 degrees Celsius before requiring some sort of coating protection or material change (e.g. high-temp steels, superalloys). The multifunctional coating system according to various embodiments described herein meets the tribological requirements, while supporting increased operating temperatures. As used herein the terms "tribology" or "tribological" have their ordinary meanings, and refer generally to the science of interacting surfaces in relative motion, encompassing concepts such as friction, wear, and lubrication.

According to various embodiments, a lightweight hypersonic missile fin may be comprised of a titanium alloy based substrate (e.g. Ti-64, $Ti_{21}S$, Ti metal matrix composite) with a thermal barrier coating (TBC) overlay. The TBC may comprise a bond layer, an insulating layer, and a sealant layer. The outer surface of the titanium fin may optionally have a modified surface layer from plasma etching and/or an intermix interface comprised of Ti—Al for high bonding strength. The bond layer may be a dense multilayered Ti—Al—Nb—N system in a superlattice structure. The coating may be designed for coefficient of thermal expansion (CTE) matching between bond layer and substrate, as well as improved strain tolerance for thermal shock resistance. The layer may also serve as a secondary thermally insulating layer and oxidation resistance layer due to phonon scattering effects from alternating nanoscale bilayers. The insulating layer may be a 7-8 mol % Yttria-stabilized zirconia (YSZ) insulating layer with columnar microstructure for thermal shock resistance. The sealant layer may be an aluminum nitride (AlN) or hexagonal phase boron nitride (hBN) conformal film to act as an oxygen diffusion barrier, a low-friction surface, and a high-thermal conductive layer for the avoidance of hot-spots. The missile fin will be inherently lightweight by using a low density material, such as a titanium-based alloy, instead of steel or a superalloy. Further weight reduction of the structure may also be achieved by using hollow airfoils construction in conjunction with the TBC system. Titanium aerostructures with hollow airfoil design are typically constrained by poor elevated mechanical properties, which the TBC mitigates.

Applications of the invention are not limited to those expressly recited. A person having ordinary skill in the art will readily appreciate additional applications based on the properties demonstrated, including but not limited to weight, strain tolerance, thermal shock resistance, and oxidation resistance. Possible commercial applications include, but are not limited to, aircraft engine components, such as compressor blades, comprised of titanium alloy, automotive exhaust systems comprised of titanium alloy, or lower operating temperature turbine blades.

Various embodiments may also be employed with a variety of titanium-containing materials, including but not limited to, titanium metal matrix composites, such as titanium aluminides, titanium-titanium boride, and titanium-silicon carbide.

Benefits

Figure 9:
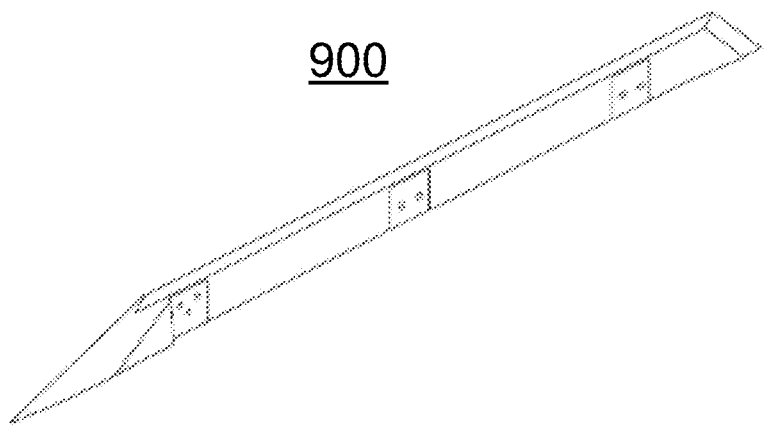
FIG. 9 is an example according to various embodiments illustrating the structure of a fixed fin for a cruise missile.

Still further applications will become apparent upon consideration of some quantifiable benefits of various embodiments. For example, the cruise range of a missile may be determined via the Breguet cruise range equation (I):

$$R = (VI_{SP})\left(\frac{L}{D}\right)\ln\left[\frac{W_{BC}}{\left(W_{BC} - W_{\frac{f}{p}}\right)}\right] \quad (I)$$

wherein R is the cruise range, V is the velocity, $I_{SP}$ is the specific impulse, L/D is the aerodynamic efficiency, $W_{BC}$ is the weight at the beginning of cruise, and $W_{F/P}$ is the fuel or propellant weight. For a Ramjet cruise missile at an altitude of 60,000 feet: V is 2901 ft/s; $I_{SP}$ is 1040 s; and L/D is 3.15. Each Ramjet cruise missile includes four fins 900 as illustrated in FIG. 9. Each fin has a length of 42 inches, a width of 2.54 inches, and a thickness of 0.87 inches. The fins may be constructed of an INCONEL® alloy 718, which is a high-strength, corrosion-resistant nickel chromium material used at −423° to 1300° F.; such an alloy has a density of 0.297 lb/in³ and the four fins would, therefore, weigh 110.24 lbs. The fins may be constructed of Alloy 17-4PH, which is a chromium-nickel-copper precipitation-hardening martensitic stainless steel with an addition of niobium; such an alloy has a density of 0.280 lb/in³ and the four fins would, therefore, weigh 104 lbs. According to various embodiments describe herein the fins may now be constructed of a titanium alloy, such as, for example, Ti-6Al-4V. Such an alloy has a density of 0.16 lb/in³ and the four fins would, therefore, weigh only 59.2 lbs, thereby reducing the weight by about 50 lbs.

Figure 10A:
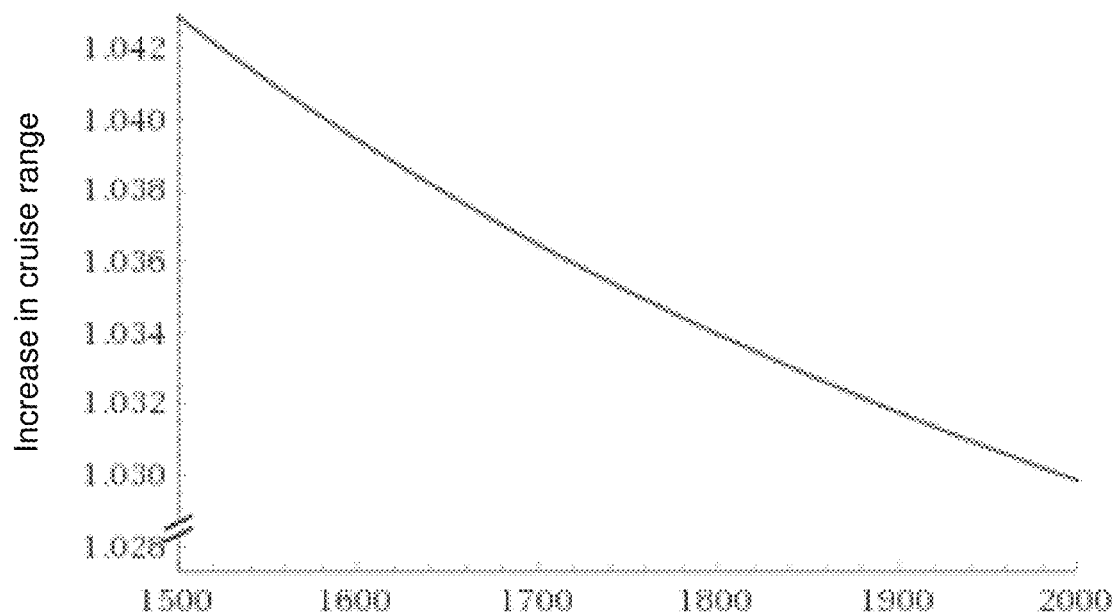
FIG. 10A is an example according to various embodiments illustrating a plot of increase in cruise range versus the weight at the beginning of cruise in pounds, according to Breguet cruise range equation.
Figure 10B:
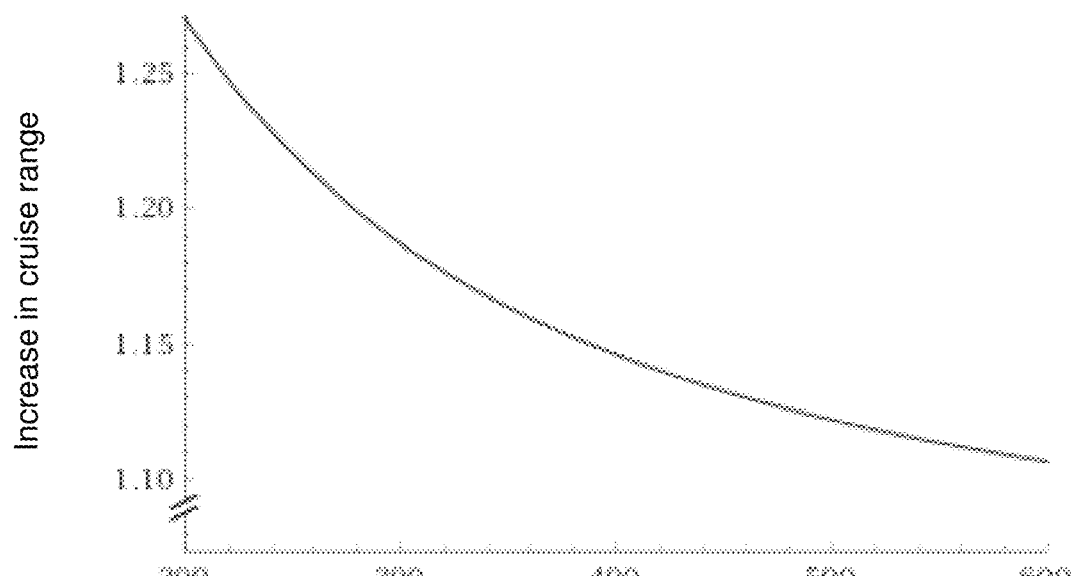
FIG. 10B is an example according to various embodiments illustrating a plot of increase in cruise range versus the fuel weight in pounds, according to Breguet cruise range equation.

A reduction in weight of 50 lbs provides significant benefits as illustrated in FIGS. 10A and 10B. FIG. 10A is an example according to various embodiments illustrating a plot of increase in cruise range (R) versus the weight at the beginning of cruise in pounds ($W_{BC}$), according to Breguet cruise range equation (I). FIG. 10B is an example according to various embodiments illustrating a plot of increase in cruise range (R) versus the fuel weight in pounds ($W_F$), according to Breguet cruise range equation (I).

EXAMPLES

Introduction

The following examples are put forth to provide those of ordinary skill in the art with a complete disclosure and description of how to perform the methods, how to make, and how to use the compositions and compounds disclosed and claimed herein. Efforts have been made to ensure accuracy with respect to numbers (e.g., amounts, temperature, etc.), but some errors and deviations should be accounted for.

The purpose of the following examples is not to limit the scope of the various embodiments, but merely to provide examples illustrating specific embodiments.

Example 1

Figure 11A:
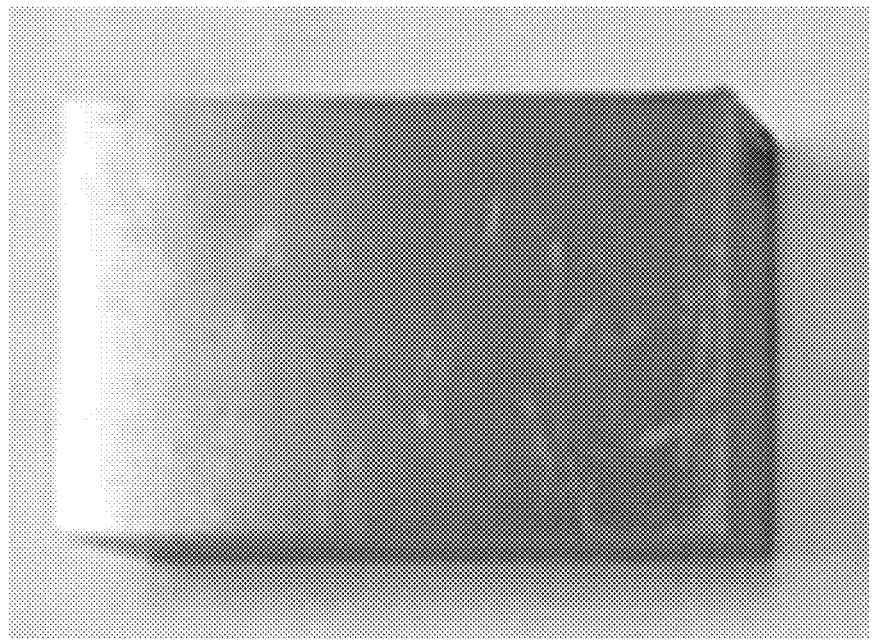
FIG. 11A is an example according to various embodiments illustrating a slab of Ti-6Al-4V before furnace annealing for 20 minutes at 800 degrees Celsius.
Figure 11B:
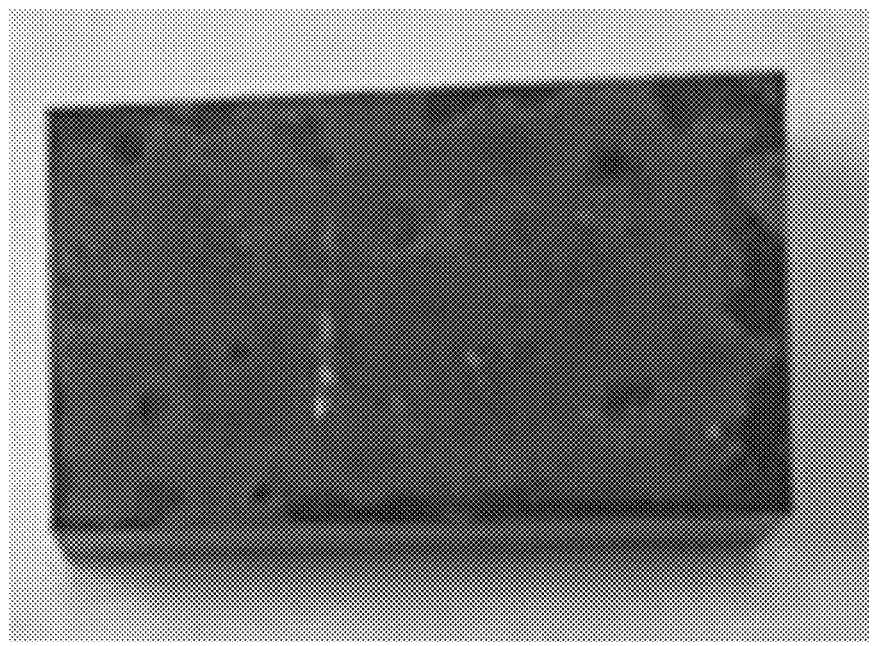
FIG. 11B is an example according to various embodiments illustrating a slab of Ti-6Al-4V after furnace annealing for 20 minutes at 800 degrees Celsius.

A purpose of this example is to demonstrate that a titanium alloy may have poor high-temperature oxidation resistance. Titanium alloys are typically not suitable for temperatures exceeding about 350 to 400 degrees Celsius. Here, a slab of Ti-6Al-4V was annealed in a furnace for 20 minutes at 800 degrees Celsius. Ti-6Al-4V is an alpha-beta titanium alloy, which is also sometimes called TC4 or Ti64. As with any alloy, the composition of Ti-6Al-4V may vary, but in general, Ti-6Al-4V comprises: from about 3.5 to about 4.5 wt. % vanadium (V); from about 5.5 to about 6.75 wt. % aluminum (Al); up to about 0.3 wt. % Iron (Fe); up to about 0.2 wt. % Oxygen (O); up to about 0.08 wt. % Carbon (C); up to about 0.05 wt. % Nitrogen (N); up to about 0.015 wt. % Hydrogen (H); up to about 0.005 wt. % Yittrium (Y); with the balance being titanium (Ti). FIG. 11A is an example according to various embodiments illustrating a slab of Ti-6Al-4V before furnace annealing for 20 minutes at 800 degrees Celsius. FIG. 11B is an example according to various embodiments illustrating a slab of Ti-6Al-4V after furnace annealing for 20 minutes at 800 degrees Celsius. The slab shown in FIG. 11B shows oxidation, demonstrating that titanium and titanium alloys typically have poor high-temperature oxidation resistance.

Example 2

A purpose of this example is to demonstrate the oxidation resistance of a superlattice bond coat according to various embodiments. A slab of Ti-6Al-4V was coated with approximately 20 μm of TiN/AlN superlattice multilayer with bilayer thickness of approx. 8.5 nm using Plasma Enhanced Magnetron Sputtering (PEMS) with a 50:50 at. % Ti—Al target within a Ar+$N_2$ gas mixture. The coated slab was annealed in air at 800 degrees Celsius for 20 minutes alongside an uncoated slab of Ti-6Al-4V.

Figure 12A:
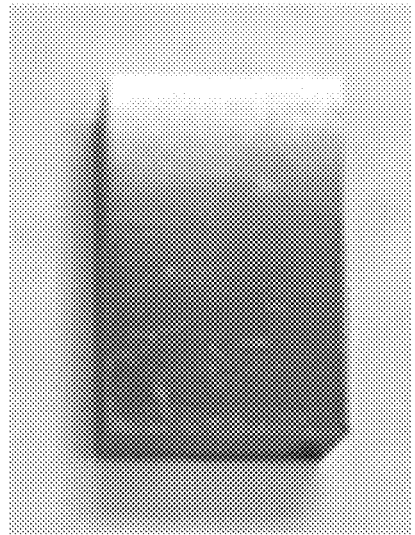
FIG. 12A is an example according to various embodiments illustrating an uncoated slab of Ti-6Al-4V prior to annealing.
Figure 12B:
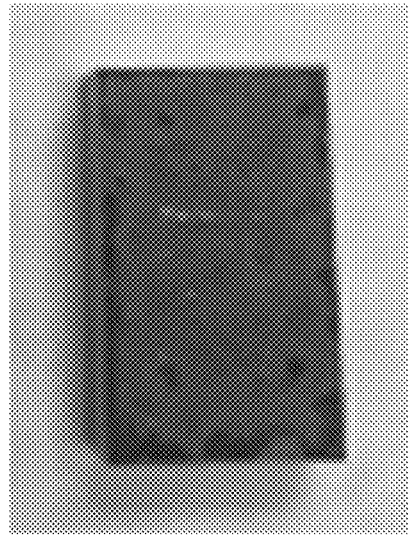
FIG. 12B is an example according to various embodiments illustrating an uncoated slab of Ti-6Al-4V after annealing at 800 degrees Celsius for 20 minutes.

FIG. 12A is an example according to various embodiments illustrating the uncoated slab of Ti-6Al-4V prior to annealing. FIG. 12B is an example according to various embodiments illustrating the uncoated slab of Ti-6Al-4V after annealing at 800 degrees Celsius for 20 minutes. The uncoated slab suffered oxidation damage as a result of the annealing.

Figure 13A:
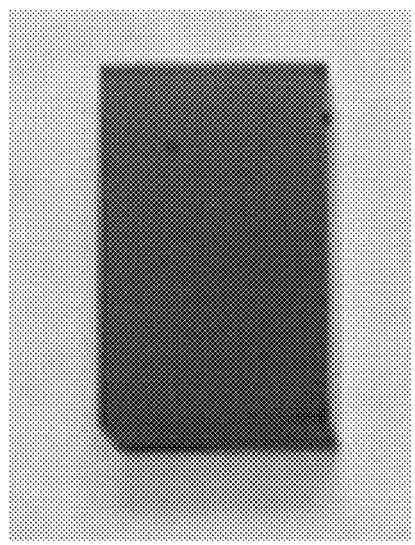
FIG. 13A is an example according to various embodiments illustrating a slab of Ti-6Al-4V coated with a TiN/AlN multilayer before annealing.
Figure 13B:
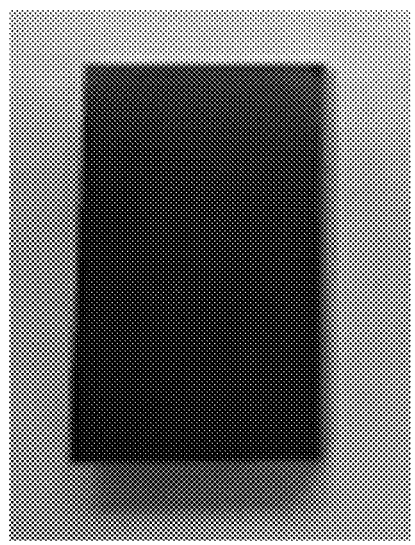
FIG. 13B is an example according to various embodiments illustrating a slab of Ti-6Al-4V coated with a TiN/AlN multilayer after annealing.

FIG. 13A is an example according to various embodiments illustrating the slab of Ti-6Al-4V coated with a TiN/AlN multilayer before annealing. FIG. 13B is an example according to various embodiments illustrating the slab of Ti-6Al-4V coated with a TiN/AlN multilayer after annealing. The multilayered coating of TiN/AlN still remained on the slab after annealing.

Figure 14:
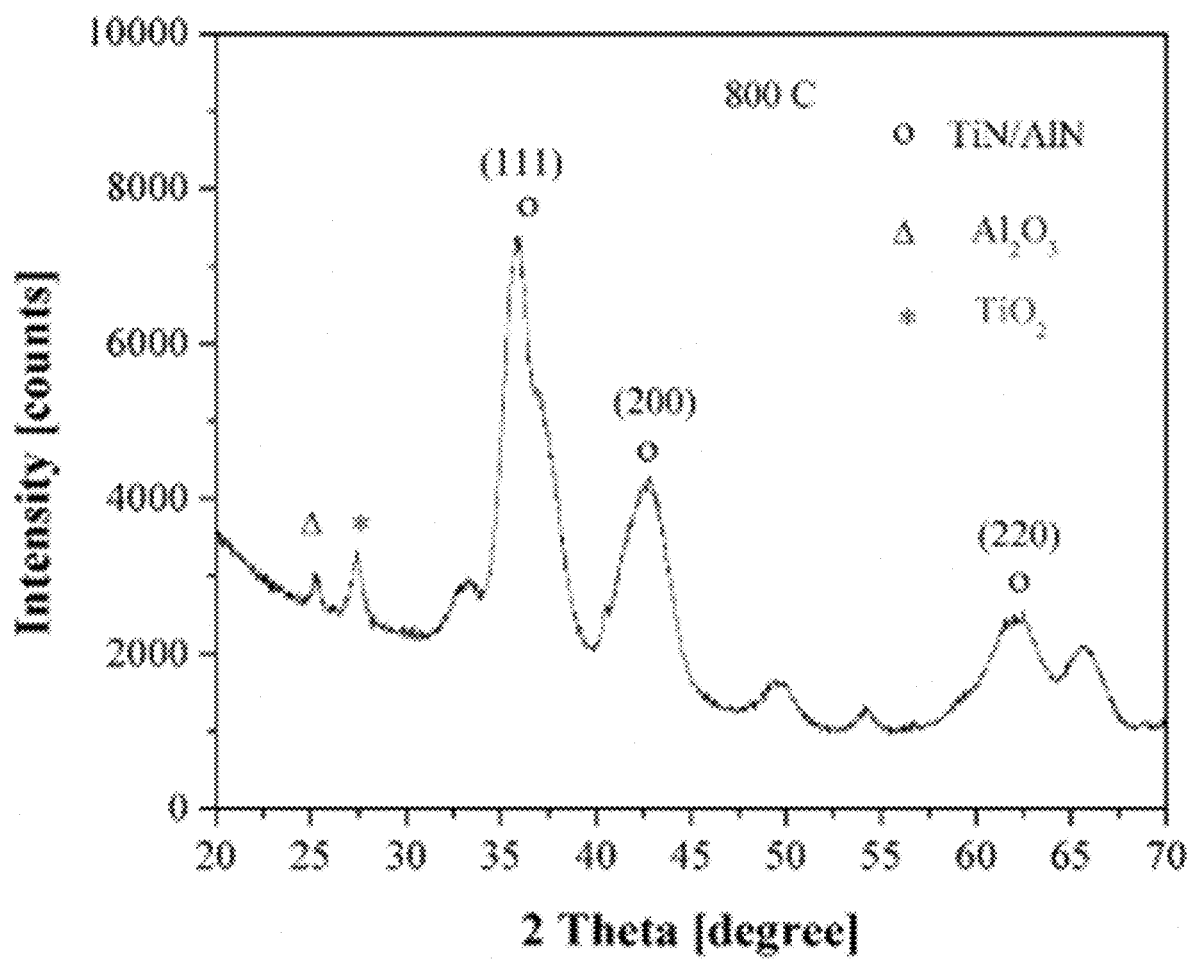
FIG. 14 is an example according to various embodiments illustrating an X-Ray Diffraction (XRD) chart showing results of an XRD test of the slab of Ti-6Al-4V coated with a TiN/AlN multilayer after annealing.

FIG. 14 is an example according to various embodiments illustrating an X-Ray Diffraction (XRD) chart showing results of an XRD test of the slab of Ti-6Al-4V coated with a TiN/AlN multilayer after annealing. The XRD chart shows the presence of TiN/AlN, aluminum-oxide, and titanium-oxide.

Figure 15A:
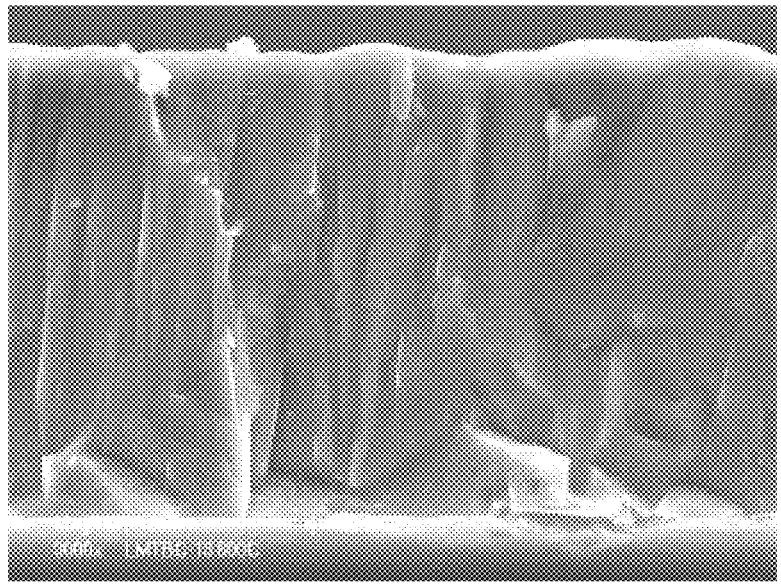
FIG. 15A is an example according to various embodiments illustrating an SEM image of the multilayered coating of TiN/AlN still remaining on the slab after annealing.
Figure 15B:
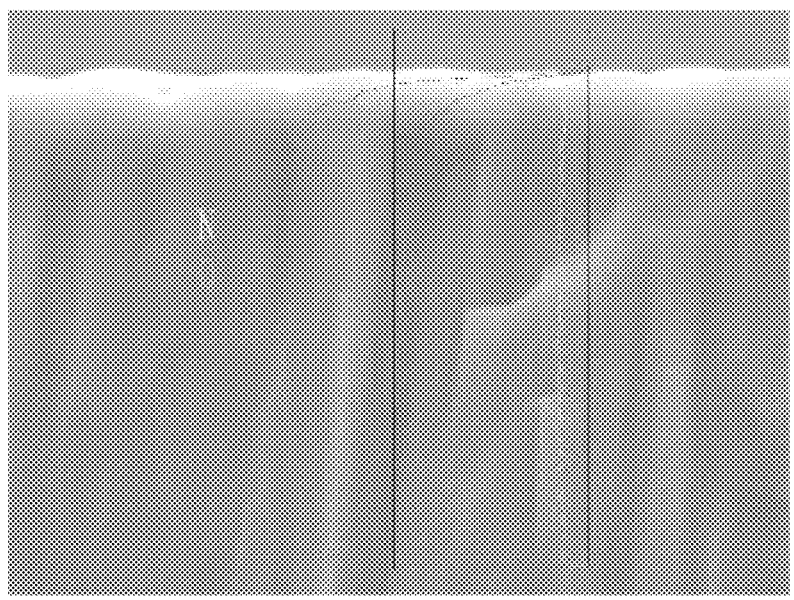
FIG. 15B is an example according to various embodiments illustrating an enlarged portion of the SEM image shown in FIG. 15A.

FIG. 15A is an example according to various embodiments illustrating an SEM image of the multilayered coating of TiN/AlN still remaining on the slab after annealing. FIG. 15B is an example according to various embodiments illustrating an enlarged portion of the SEM image shown in FIG. 15A. The images confirm that a thermally grown oxide (TGO) layer forms at elevated temperature on the surface of the TiN/AlN superlattice multilayer, which increases oxidation resistance. The TGO includes a layer of aluminum-oxide, having a thickness of about 200 nm.

Example 3

A purpose of this example is to demonstrate the impact that the thermal insulation provided by a TiN/AlN multilayer coating has on the morphology of a Ti-15Mo-3Nb-3Al-0.2Si alloy. As with any alloy, the composition of Ti-6Al-4V may vary, but in general, Ti-15Mo-3Nb-3Al-0.2Si comprises: from about 14 to about 16 wt. % Molybdenum (Mo); from about 2.4 to about 3.2 wt. % Niobium (Nb); from about 2.5 to about 3.5 wt. % Aluminum (Al); from about 0.15 to about 0.25 wt. % Silicon (Si); from about 0.11 to about 0.17 wt. % Oxygen (O); up to about 0.4 wt. % Iron (Fe); up to about 0.015 wt. % Hydrogen (H); up to about 0.05 wt. % Carbon (C); up to about 0.05 wt. % Nitrogen (N); with the balance being Titanium. A slab of Ti-15Mo-3Nb-3Al-0.2Si was coated with a TiAlN/AlN multilayer coating using Plasma Enhanced Magnetron Sputtering (PEMS) in an Ar+N₂ gas mixture using a 50:50 at. % Ti—Al target and pure aluminum target. The TAlN/AlN layer then had an Yttria Stabilized Zirconia (YSZ) layer deposited on top of it using reactive sputtering in an Ar+O₂ gas mixture. The TBC was annealed at 800 degrees Celsius for 25 minutes alongside an uncoated slab of Ti-15Mo-3Nb-3Al-0.2Si.

Figure 16A:
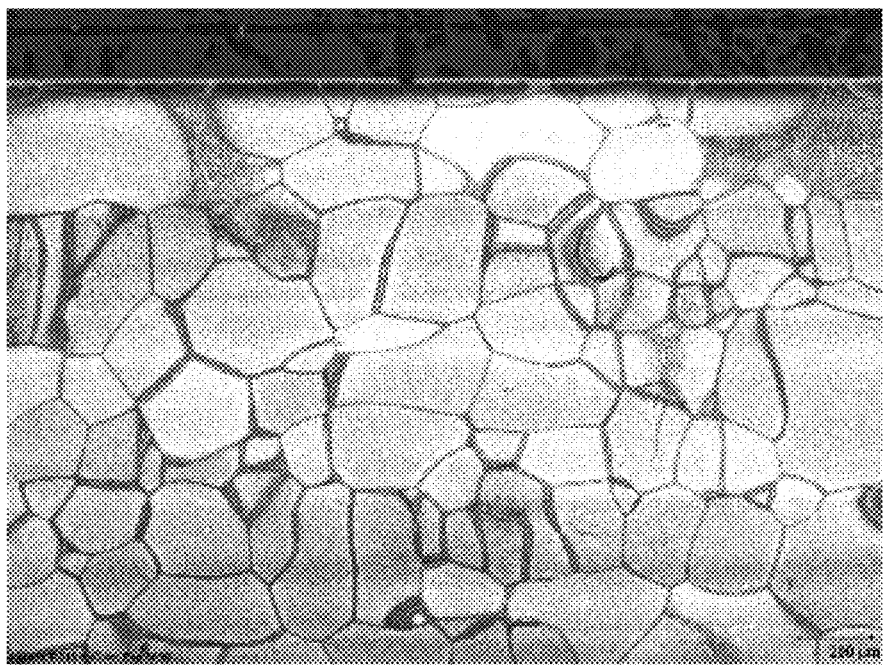
FIG. 16A is an example according to various embodiments illustrating an uncoated slab of Ti-15Mo-3Nb-3Al-0.2Si after annealing at 800 degrees Celsius for 25 minutes.

FIG. 16A is an example according to various embodiments illustrating an uncoated slab of Ti-15Mo-3Nb-3Al-0.2Si after annealing at 800 degrees Celsius for 25 minutes. As can be seen, recrystallized grain growth occurred throughout the slab of Ti-15Mo-3Nb-3Al-0.2Si.

Figure 16B:
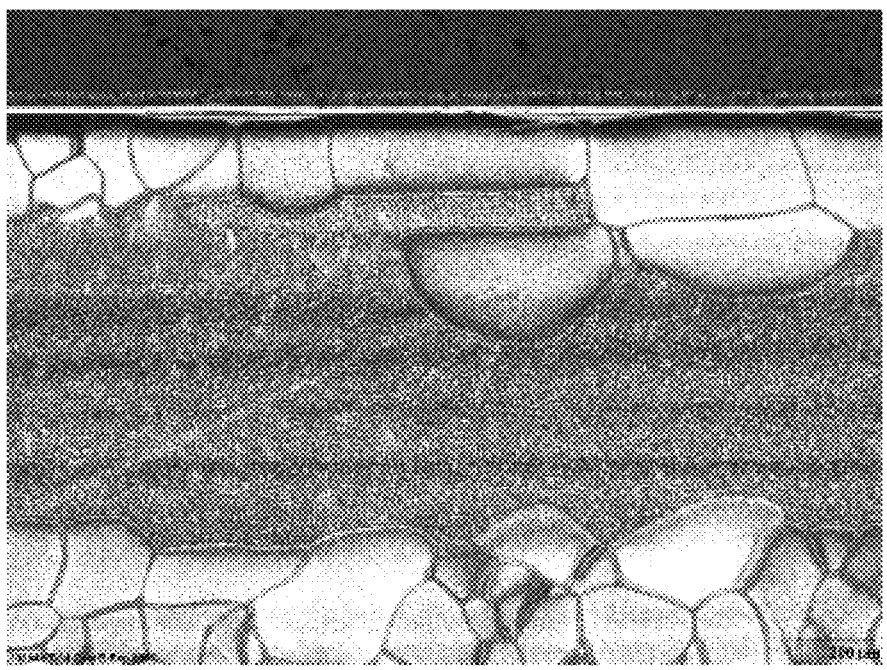
FIG. 16B is an example according to various embodiments illustrating a slab of Ti-15Mo-3Nb-3Al-0.2Si coated with a TiAlN/AlN multilayer coating after annealing at 800 degrees Celsius for 25 minutes.

FIG. 16B is an example according to various embodiments illustrating a slab of Ti-15Mo-3Nb-3Al-0.2Si coated with a TiAlN/AlN multilayer coating using Plasma Enhanced Magnetron Sputtering (PEMS) in an Ar+N₂ gas mixture using a 50:50 at. % Ti—Al target and pure aluminum target. The TiAlN/AlN layer then had an Yttria Stabilized Zirconia (YSZ) layer deposited on top of it using reactive sputtering in an Ar+O₂ gas mixture after. The slab underwent annealing at 800 degrees Celsius for 25 minutes. As can be seen, a significant fraction of the original beta phase remained and did not recrystallize.

In addition to the thermal insulation, the oxidation resistance may be preserved at temperatures up to about 1000 degrees Celsius for durations of about 20 minutes.

Example 4

A purpose of this example is to demonstrate the interfacial adhesion as well as the film brittleness and cohesion of a TiAlN/AlN multilayer coating on a Ti-6Al-4V alloy.

The well-known Rockwell C indentation test, prescribed by the VDI 3198 norm, as a destructive quality test for coated compounds, was employed. According to the test, a conical diamond indenter penetrates into the surface of a coated compound, thus inducing massive plastic deformation to the substrate and fracture of the coating. The contact geometry, in combination with the intense load transfer, induces extreme shear stresses at the interface. Only well adhered coatings, manage to withstand these shear stresses and to prevent extended delamination circumferentially to the imprint. The Rockwell C test may rigorously exhibit two distinctive properties of the coated compound, i.e., the interfacial adhesion as well as the film brittleness and cohesion. The stress-strain field, which occurs during the indentation and the relaxation stages respectively, must be thoroughly considered in order to obtain secure conclusions, regarding the quality of the coating substrate system.

Figure 17:
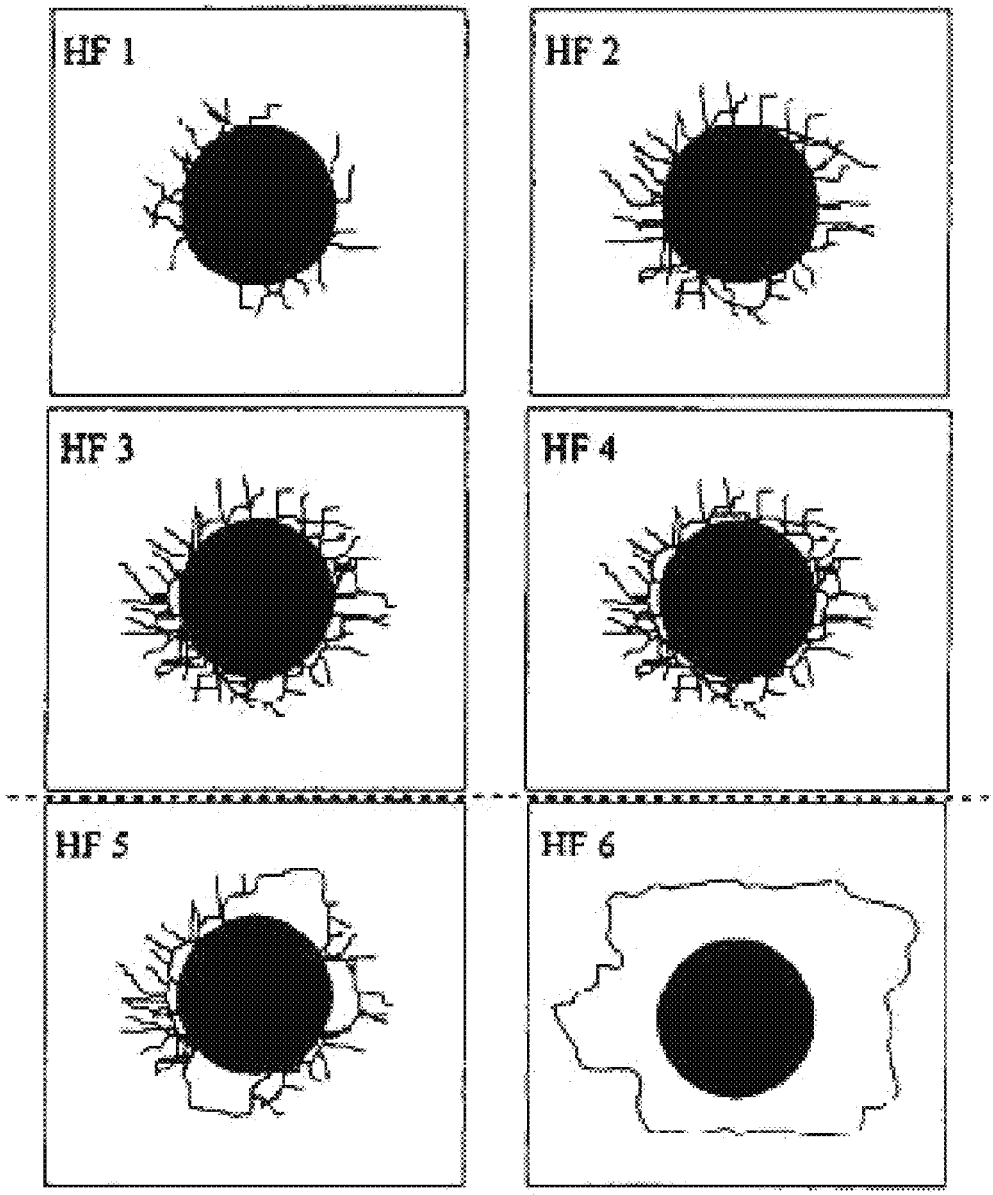
FIG. 17 is an example according to various embodiments illustrating standardized result characterizations for the Rockwell C indentation test is prescribed by the VDI 3198 norm.

FIG. 17 is an example according to various embodiments illustrating standardized result characterizations for the Rockwell C indentation test which is prescribed by the VDI 3198 norm.

Figure 18A:
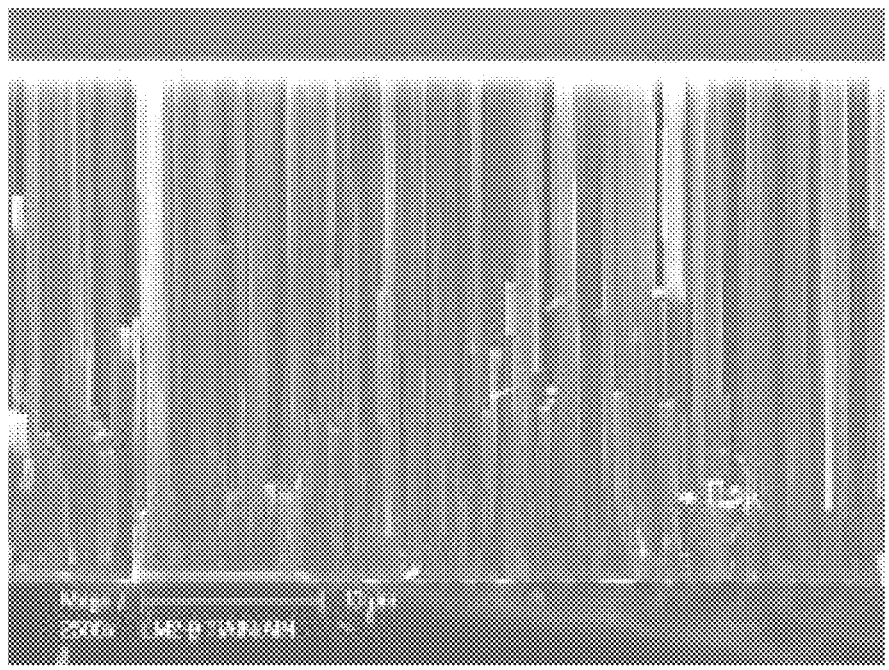
FIG. 18A is an example according to various embodiments illustrating an SEM micrograph of the 30 μm TiAlN/AlN multilayer coating that was deposited on a Ti-6Al-4V alloy.

FIG. 18A is an example according to various embodiments illustrating an SEM micrograph of the 30 μm TiAlN/AlN multilayer coating that was deposited on a Ti-6Al-4V alloy.

Figure 18B:
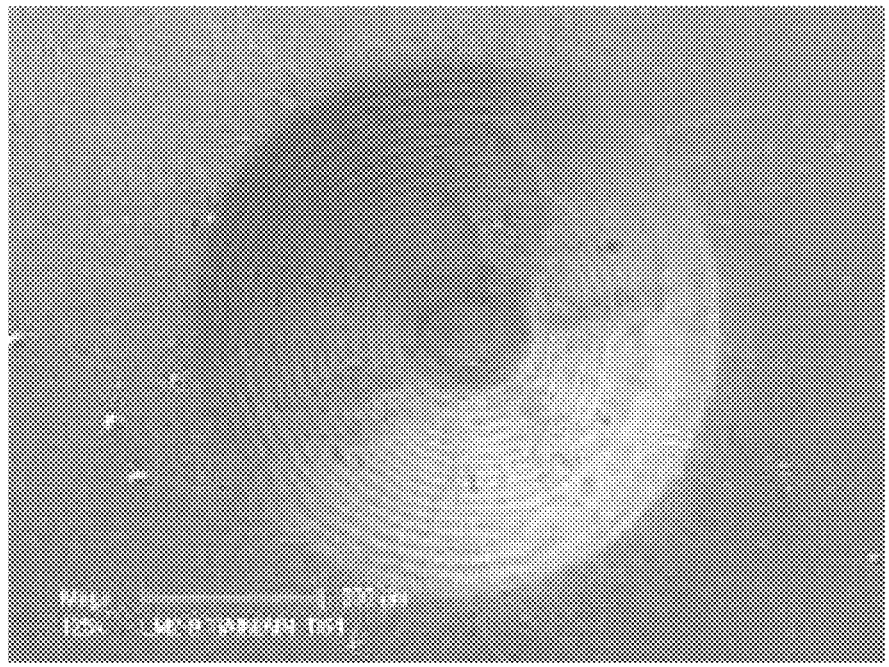
FIG. 18B is an example according to various embodiments illustrating an SEM micrograph of the surface of the coated alloy after the indentation test.

FIG. 18B is an example according to various embodiments illustrating an SEM micrograph of the surface of the coated alloy after the indentation test. As can be seen by comparing FIG. 18B with the standardized result characterizations shown in FIG. 17, the TiAlN/AlN multilayer coating deposited on a Ti-6Al-4V alloy exhibited an adhesion strength quality better than HF1 adhesion. Other sputtered films were created with thicknesses greater than 70 microns while still maintaining good bonding properties.

Example 5

A purpose of this example is to demonstrate the interfacial adhesion as well as the film brittleness and cohesion of a TiAlN/AlN multilayer coating on a Ti-15Mo-3Nb-3Al-0.2Si alloy. A slab of Ti-15Mo-3Nb-3Al-0.2Si was coated with a TiAlN/AlN multilayer coating using Plasma Enhanced Magnetron Sputtering (PEMS) in a Ar+N₂ gas mixture using a 50:50 at. % Ti—Al target and pure aluminum target.

Figure 19A:
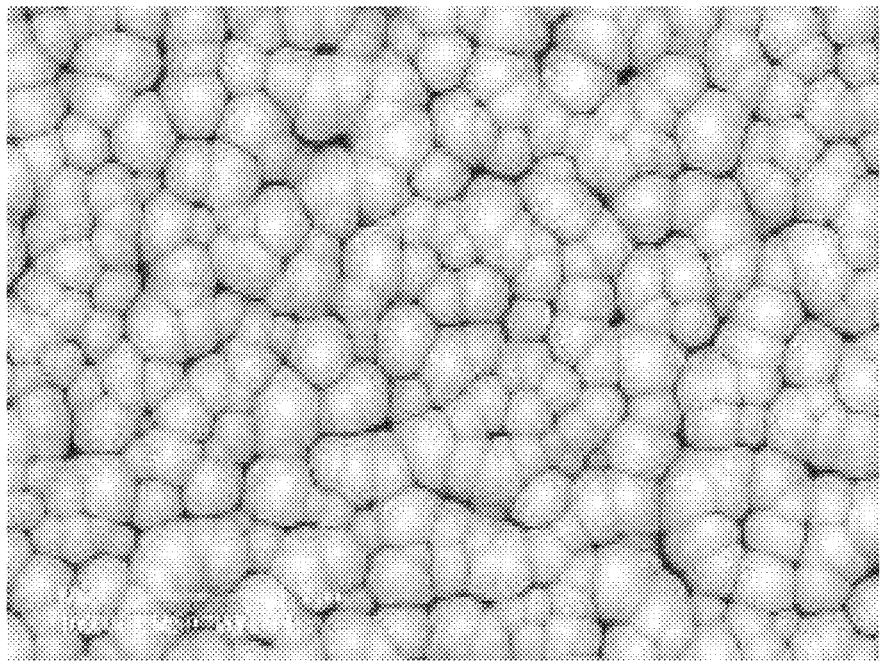
FIG. 19A is an example according to various embodiments illustrating an SEM micrograph of the 30 μm TiAlN/AlN multilayer coating that was deposited on a Ti-15Mo-3Nb-3Al-0.2Si alloy.

FIG. 19A is an example according to various embodiments illustrating an SEM micrograph of the 30 μm TiAlN/AlN multilayer coating that was deposited on a Ti-15Mo-3Nb-3Al-0.2Si alloy.

Figure 19B:
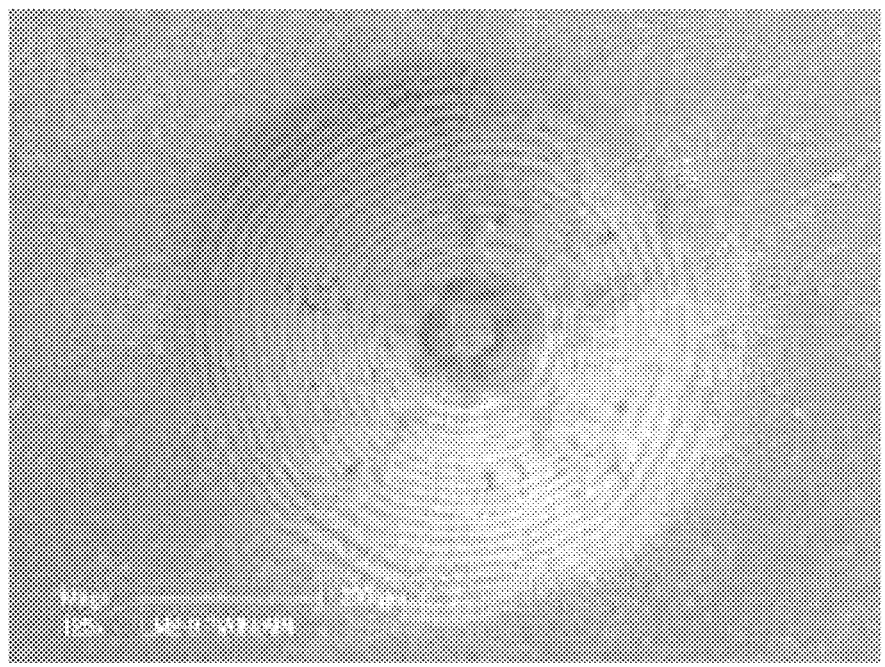
FIG. 19B is an example according to various embodiments illustrating an SEM micrograph of the surface of the coated alloy after the indentation test.

FIG. 19B is an example according to various embodiments illustrating an SEM micrograph of the surface of the coated alloy after the indentation test. As can be seen by comparing FIG. 19B with the standardized result characterizations shown in FIG. 17, the TiAlN/AlN multilayer coating deposited on a Ti-15Mo-3Nb-3Al-0.2Si alloy exhibited an adhesion strength quality better than HF1 adhesion.

Example 6

A purpose of this example is to provide a comparison of (1) an uncoated Ti-6Al-4V alloy, (2) a Ti-6Al-4V alloy having a MCrAlY/YSZ coating, and (3) a Ti-6Al-4V alloy coated with a (TiN/AlN)/YSZ/BN thermal barrier coating according to various embodiments. All three specimens were placed in an air furnace operating at 800 degrees Celsius for 25 minutes.

Figure 20A:
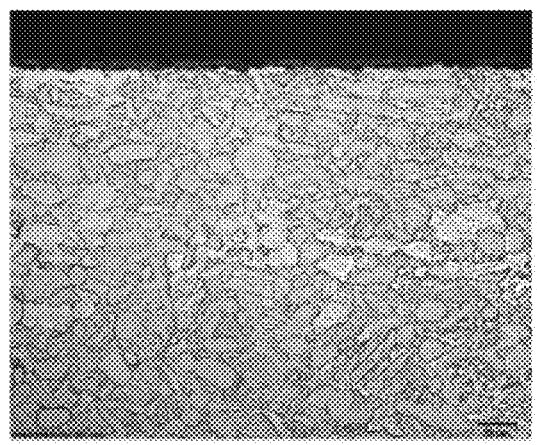
FIG. 20A is an example according to various embodiments illustrating the uncoated Ti-6Al-4V alloy after exposure in an air furnace operating at 800 degrees Celsius for 25 minutes.
Figure 20B:
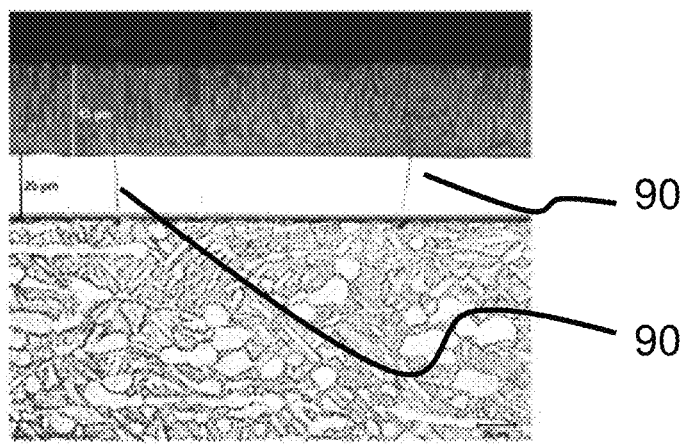
FIG. 20B is an example according to various embodiments illustrating the Ti-6Al-4V alloy having a MCrAlY/YSZ coating after exposure in an air furnace operating at 800 degrees Celsius for 25 minutes. Multiple cracks 90 developed in the MCrAlY bond coat.
Figure 20C:
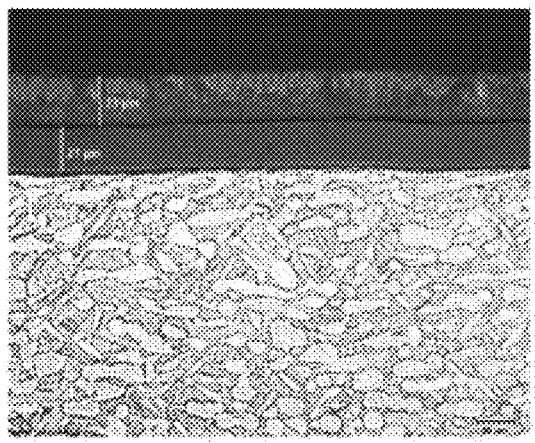
FIG. 20C is an example according to various embodiments illustrating Ti-6Al-4V alloy coated with a (TiN/AlN)/YSZ/BN thermal barrier coating according to various embodiments after exposure in an air furnace operating at 800 degrees Celsius for 25 minutes.

FIG. 20A is an example according to various embodiments illustrating the uncoated Ti-6Al-4V alloy after exposure in an air furnace operating at 800 degrees Celsius for 25 minutes. FIG. 20B is an example according to various embodiments illustrating the Ti-6Al-4V alloy having a MCrAlY/YSZ coating after exposure in an air furnace operating at 800 degrees Celsius for 25 minutes. Multiple cracks 90 developed in the MCrAlY bond coat. Without wishing to be bound by theory, it appears that CTE mismatch between the MCrAlY bond coat and the alloy and/or prior residual stress from deposition resulted in crack propagation within the sputtered MCrAlY bond coat. FIG. 20C is an example according to various embodiments illustrating Ti-6Al-4V alloy coated with a (TiN/AlN)/YSZ/BN thermal barrier coating according to various embodiments after exposure in an air furnace operating at 800 degrees Celsius for 25 minutes. Again, without wishing to be bound by theory, the absence of cracks in the TiN/AlN bond layer sample with thinner a YSZ layer was possibly due to better material compatibility.

Example 7

A purpose of this example is to provide a comparison of a Ti-15Mo-3Nb-3Al-0.2Si alloy having a MCrAlY/YSZ coating, and (3) a Ti-15Mo-3Nb-3Al-0.2Si alloy coated with a (TiN/AlN)/YSZ/BN thermal barrier coating according to various embodiments.

Figure 21A:
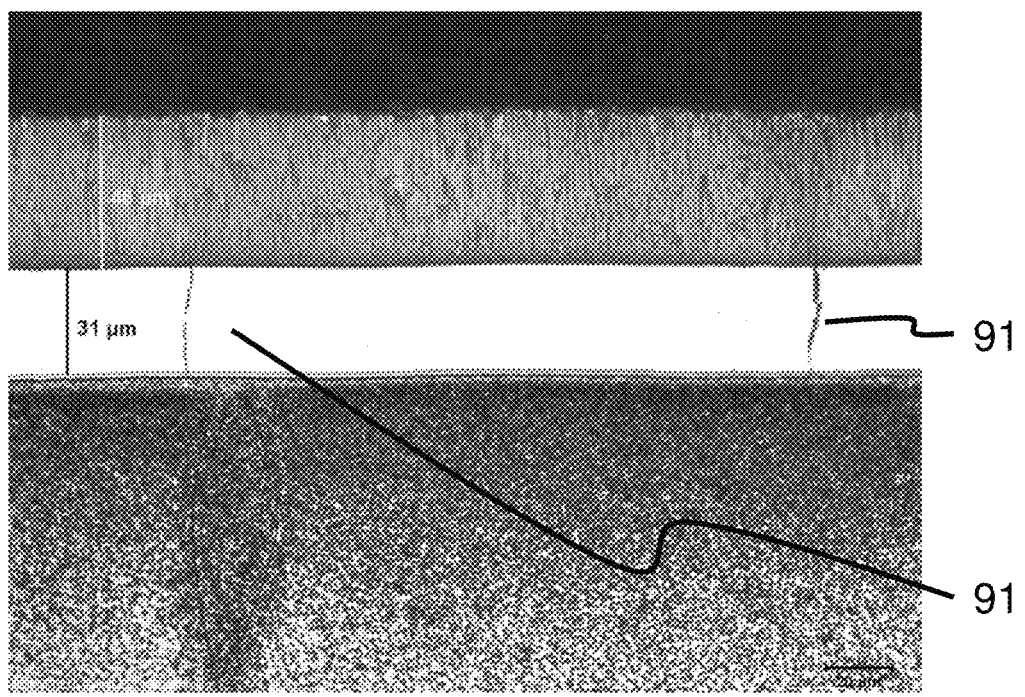
FIG. 21A is an example according to various embodiments illustrating a Ti-15Mo-3Nb-3Al-0.2Si alloy having a MCrAlY/YSZ coating after being subjected to an air furnace at 800 degrees Celsius for 25 minutes.
Figure 21B:
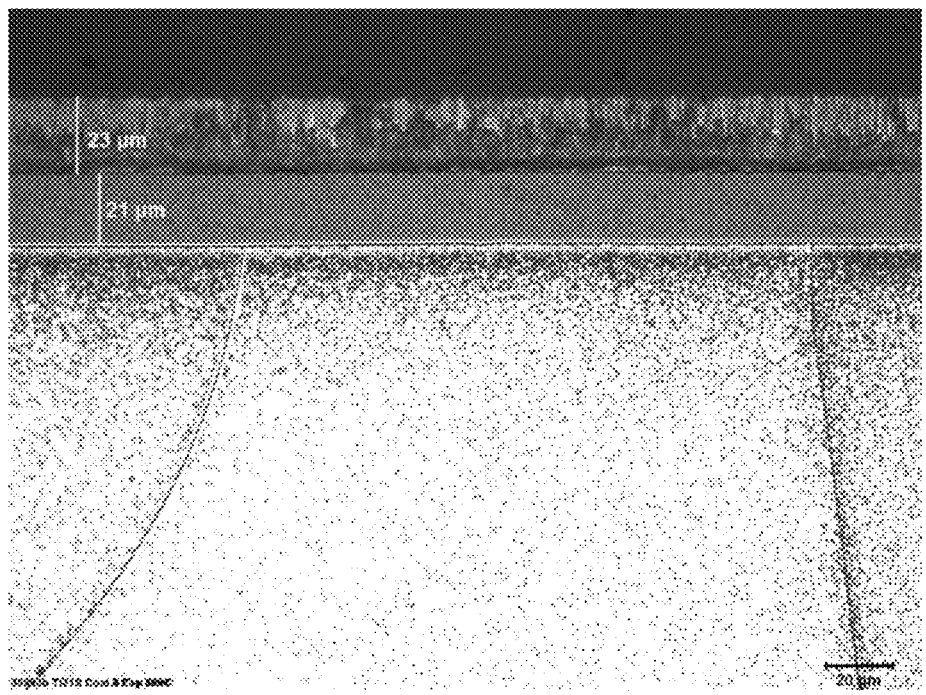
FIG. 21B is an example according to various embodiments illustrating a Ti-15Mo-3Nb-3Al-0.2Si alloy coated with a (TiN/AlN)/YSZ/BN thermal barrier coating according to various embodiments after being subjected to an air furnace at 800 degrees Celsius for 25 minutes.

FIG. 21A is an example according to various embodiments illustrating a Ti-15Mo-3Nb-3Al-0.2Si alloy having a MCrAlY/YSZ coating after being subjected to an air furnace at 800 degrees Celsius for 25 minutes. Multiple cracks 91 developed in the MCrAlY bond coat. Without wishing to be bound by theory, it appears that CTE mismatch between the MCrAlY bond coat and the alloy and/or prior residual stress from deposition resulted in crack propagation within the sputtered MCrAlY bond coat. FIG. 21B is an example according to various embodiments illustrating a Ti-15Mo-3Nb-3Al-0.2Si alloy coated with a (TiN/AlN)/YSZ/BN thermal barrier coating according to various embodiments after being subjected to an air furnace at 800 degrees Celsius for 25 minutes. Again, without wishing to be bound by theory, the absence of cracks in the TiN/AlN bond layer sample with thinner a YSZ layer was possibly due to better material compatibility.

Example 8

Figure 22A:
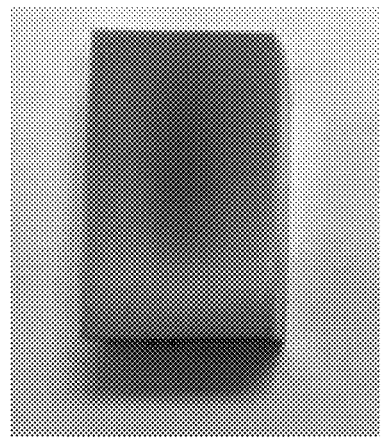
FIG. 22A shows a Ti-6Al-4V substrate coated with a BN sealant layer prior to annealing.
Figure 22B:
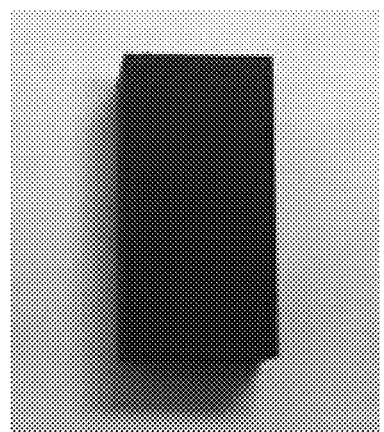
FIG. 22B shows a Ti-6Al-4V substrate coated with a BN sealant layer after annealing in an air furnace at 900 degrees Celsius for 20 minutes.
Figure 22C:
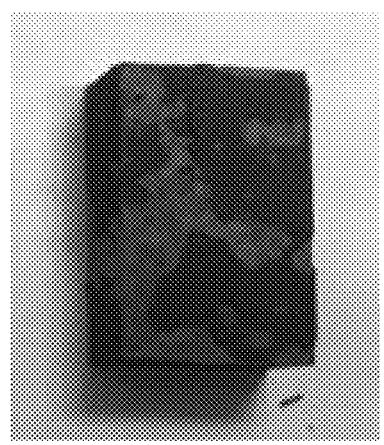
FIG. 22C shows a Ti-6Al-4V substrate coated with a BN sealant layer after annealing in an air furnace at 1000 degrees Celsius for 20 minutes.

A purpose of this example is to test the oxidation of a BN sealant layer according to various embodiments at various temperatures. Multiple Ti-6Al-4V substrates were coated with 200-300 nm of BN sealant layers by backfilling with triethylborane, $BC_3H_9$ at 5 millitorr and then using the Plasma Immersion Ion assisted Deposition (PIID) technique. FIG. 22A shows a Ti-6Al-4V substrate coated with a BN sealant layer prior to annealing. FIG. 22B shows a Ti-6Al-4V substrate coated with a BN sealant layer after annealing in an air furnace at 900 degrees Celsius for 20 minutes. FIG. 22C shows a Ti-6Al-4V substrate coated with a BN sealant layer after annealing in an air furnace at 1000 degrees Celsius for 20 minutes.

Example 9

A purpose of this example is to demonstrate tribological properties of a titanium alloy coated with a thermal barrier coating according to various embodiments when in contact with an uncoated titanium alloy.

Figure 23A:
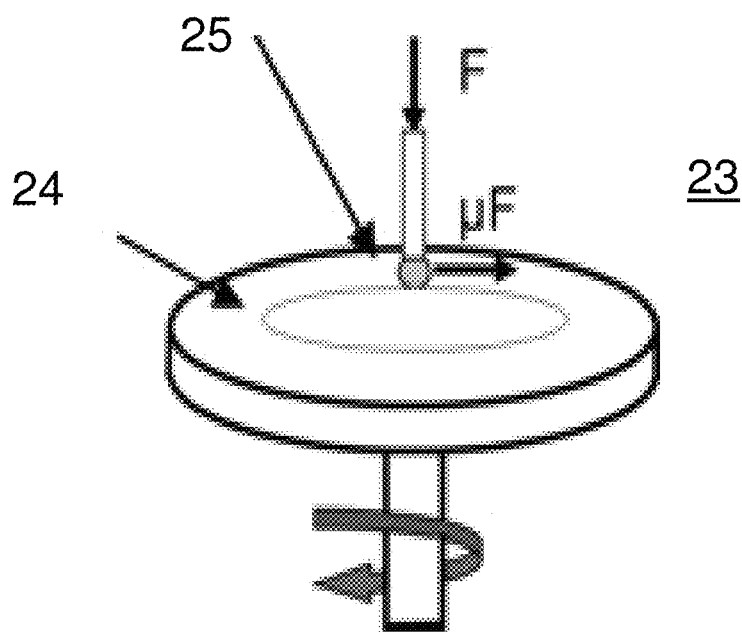
FIG. 23A is an example according to various embodiments illustrating an apparatus for testing the coefficient of friction.
Figure 23B:
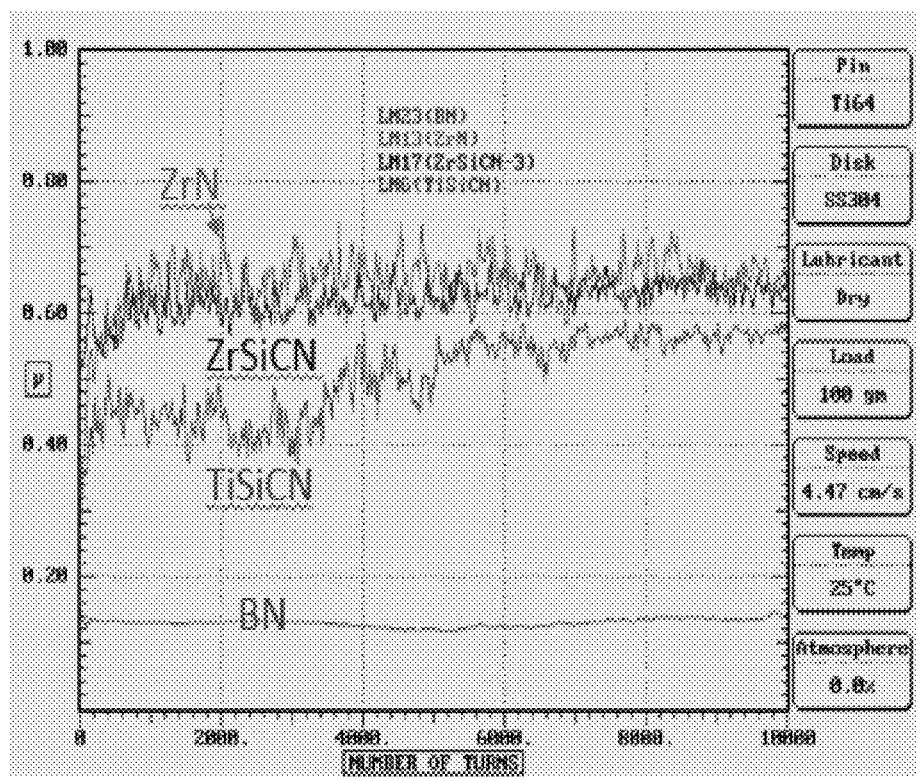
FIG. 23B is an example according to various embodiments illustrating a chart plotting the coefficient of friction against the number of revolutions in the apparatus illustrated in FIG. 23A.

FIG. 23A is an example according to various embodiments illustrating an apparatus 23 for testing the coefficient of friction. The apparatus 23 can be used to spin a disc 24. The disc 24 may be coated with a variety of coatings. The coatings tested included Zirconium nitride (ZrN), Zirconium silicon carbon nitride (ZrSiCN), Titanium silicon carbon nitride (TiSiCN), and Boron Nitride (BN), specifically h-BN. During each test, the disc 24 was spun at 100 rpm. A ball 25 may be positioned to contact the disc 24. The ball may be pressed with a loading force (F) against the disc 24. For each coating tested, the ball comprised a Ti-6Al-4V alloy and the loading force was 1N. The testing was carried out for 10,000 revolutions for each coating.

FIG. 24B is an example according to various embodiments illustrating a chart plotting the coefficient of friction against the number of revolutions in the apparatus illustrated in FIG. 23A. A BN Sealant layer performed well as a low-friction surface against titanium counter bodies.

Example 10

A purpose of this example is to compare an uncoated substrate with substrates coated with a variety of bond layers according to various embodiments. Table 1 summarizes the coatings tested.

| Sample | Substrate | Coating |
| --- | --- | --- |
| 1 | Ti64 | 20 μm TiAlN/AlN bilayer |
| 2 | Ti64 | 20 μm TiAlN/TiAl bilayer |
| 3 | Ti64 | 20 μm TiAlN/AlN bilayer |
| 4 | Ti64 | 20 μm TiAlN/TiAl bilayer |
| 5 | Ti64 | none |

The bilayer in each sample was deposited by PEMS. Thickness of each sublayer in the bilayer was approximately ½ the thickness of the overall bilayer. The bilayer was a single bilayer and was not periodically repeating.

Each sample was tested on a Bruker UMTS device using Brinell hardness testing standards at a variety of temperatures. Specifically, hardness tests were performed at 400 degrees Celsius, 600 degrees Celsius, and 800 degrees Celsius.

Figure 24:
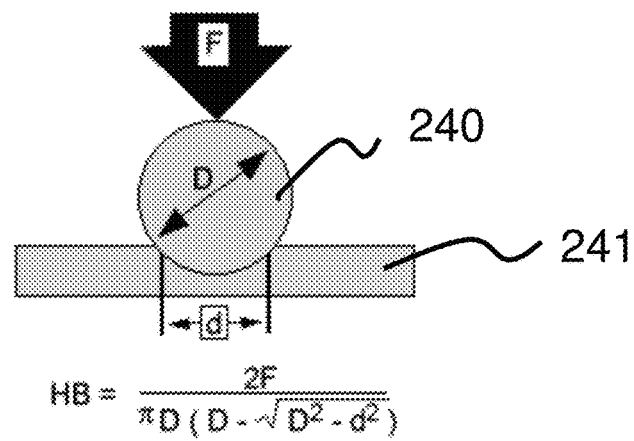
FIG. 24 is an example according to various embodiments illustrating a schematic diagram of a device used for Brinell hardness testing at various temperatures.

FIG. 24 is an example according to various embodiments illustrating a schematic diagram of a device used to conduct the Brinell hardness tests. A spherically or semi-spherically tipped probe 240 with a diameter (D) is pressed with a force (F) against the coated or uncoated substrate 241. The specific probe used in this example comprised aluminum oxide ($Al_2O_3$) and had a semi-spherically tipped probe having a diameter (D) of 0.125" (3.2 mm). The probe 240 deforms the substrate 241 and the diameter (d) of the resulting indentation is measured. The Brinell Hardness may be calculated from the load and the area of the indent, assuming a spherical geometry (D) via Equation II.

$$HB = \frac{2F}{\pi D(D - \sqrt{D^2 - d^2})} \quad \text{(II)}$$

Figure 25:
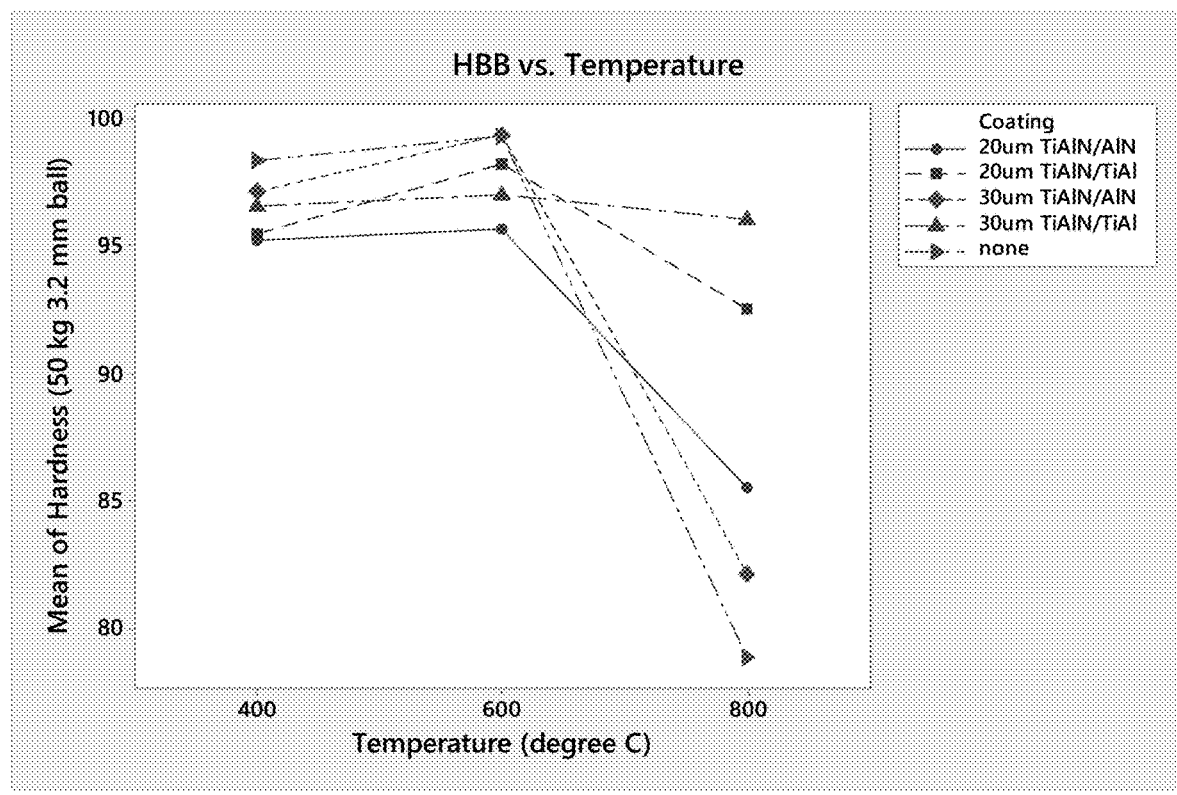
FIG. 25 is an example according to various embodiments illustrating a chart, plotting the Brinell Hardness for each of the samples tested in Example 10 at each of the tested temperatures.
Figure 26:
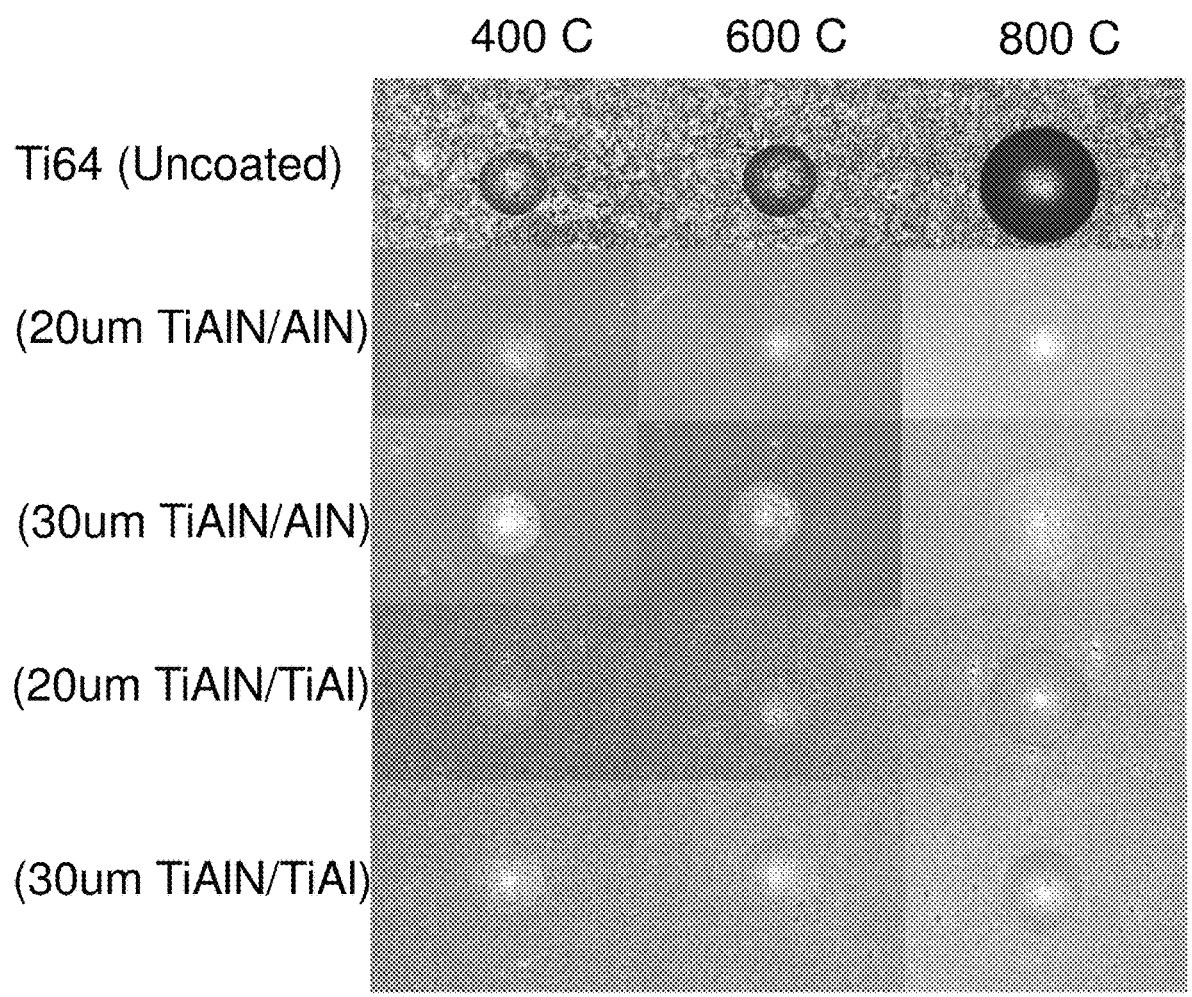
FIG. 26 is an example according to various embodiments illustrating a grid of photographs showing the indentations produced by the Brinell Hardness test for each of the samples tested in Example 10 at each of the tested temperatures.

In a first segment of testing, each sample was heated individually from room temperature to 400 degrees Celsius over a time of 5 minutes. Each sample was held at 400 degrees Celsius. Next, in a second segment, each sample was heated individually from 400 degrees Celsius to 600 degrees Celsius over a time of 5 minutes. Each sample was held at 600 degrees Celsius for 5 minutes. Next, in a third segment, each sample was heated individually from 600 degrees Celsius to 800 degrees Celsius over a time of 10 minutes. Each sample was held at 800 degrees Celsius for 5 minutes. The total testing time was 35 mins. FIG. 25 is an example according to various embodiments illustrating a chart, plotting the Brinell Hardness for each of the samples tested in Example 10 at each of the tested temperatures. FIG. 26 is an example according to various embodiments illustrating a grid of photographs showing the indentations produced by the Brinell Hardness test for each of the samples tested in Example 10 at each of the tested temperatures.

Example 11

Figure 27:
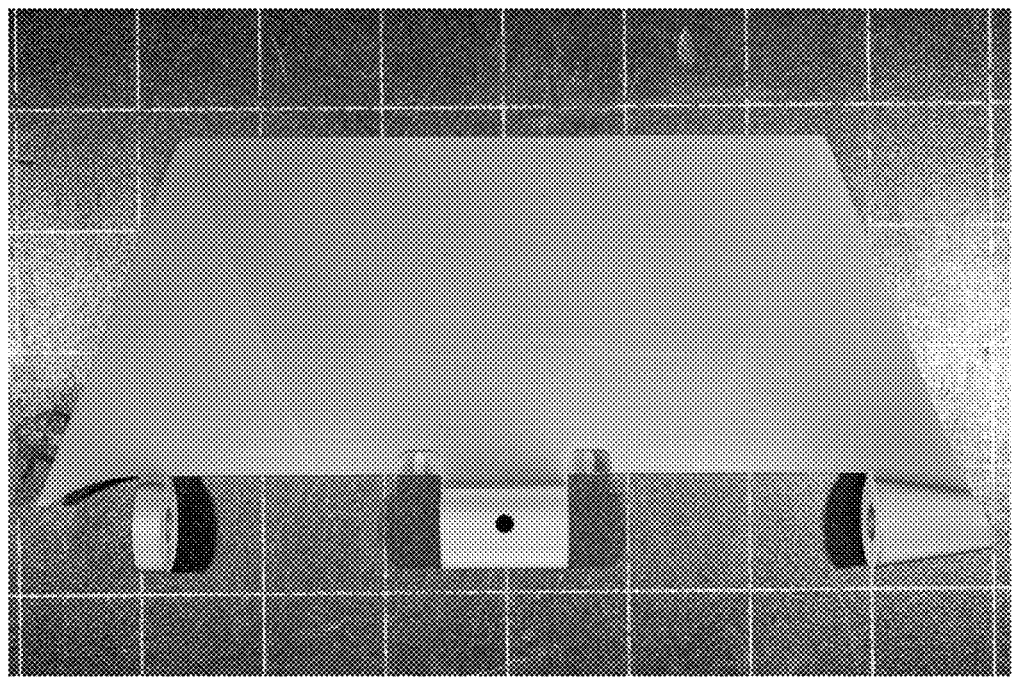
FIG. 27 is an example according to various embodiments illustrating a missile fin coated with a thermal barrier coating according to various embodiments.

A purpose of this example is to demonstrate that the inventive TBC system according to various embodiments may be deposited using sputtering techniques with very good uniformity, adhesion, and conformality. FIG. 27 is an example according to various embodiments illustrating a missile fin coated with a thermal barrier coating according to various embodiments. More specifically, FIG. 27 shows an actual missile fin (PAC-3 MSE) that has been coated with the thermal barrier coating. The fin was coated using PEMS technique. The TBC comprised a TiAlN/TiAl superlattice bond layer and an YSZ insulating layer deposited thereon. The overall coating thickness of the TBC was about 50-70 micrometers. The missile fin comprised Ti21S. As can be seen in FIG. 27, the TBC shows very good uniformity, adhesion, and conformality.

I claim:

1. A thermal barrier coating for a substrate, the thermal barrier coating comprising:
    a bond layer, the bond layer comprising selected from the group consisting of a Titanium Aluminum Niobium alloy (TiAlNb), a Titanium Aluminum Niobium Nitride alloy (TiAlNbN) and combinations thereof;
    an insulating layer disposed on the bond layer; and
    a sealant layer disposed on the insulating layer, the sealant layer comprising hexagonal boron nitride (hBN).

2. The thermal barrier coating according to claim 1, wherein the bond layer has a superlattice structure, comprising a periodically repeating group of layers.

3. The thermal barrier coating according to claim 2, wherein the periodically repeating group of layers comprises a first layer and a second layer, wherein the first layer comprises a first material, wherein the second layer comprises a second material, and wherein the first material and the second material are different.

4. The thermal barrier coating according to claim 3, wherein:
    the first material and the second material are independently selected;
    one of the first material and the second material is selected from the group consisting of the Titanium Aluminum Niobium alloy (TiAlNb), the Titanium Aluminum Niobium Nitride alloy (TiAlNbN) and the combinations thereof; and
    the other of the first material and the second material is selected from the group consisting of the Titanium Aluminum Niobium alloy (TiAlNb), the Titanium Aluminum Niobium Nitride alloy (TiAlNbN), a Titanium Aluminum Nitride (TiAlN), an Aluminum Titanium Nitride (AlTiN), a Titanium Nitride (TiN), a Titanium Aluminide (TiAl), and combinations thereof.

5. The thermal barrier coating according to claim 3, wherein each group of layers in the periodically repeating group of layers has a thickness of about 30 nm.

6. The thermal barrier coating according to claim 1, wherein the insulating layer comprises from about 7 to about 8 percent by weight of Yttria stabilized Zirconia (YSZ).

7. The thermal barrier coating according to claim 6, wherein the insulating layer has a thickness of about 30 μm.

8. The thermal barrier coating according to claim 1, wherein the sealant layer has a thickness less than about 500 nm.

9. An article of manufacture comprising a substrate and a thermal barrier coating according to claim 1 disposed thereon,
    wherein the substrate comprises at least one selected from the group consisting of titanium, a titanium alloy, an intermetallic compound of titanium, a metal matrix composite comprising titanium, and combinations thereof.

10. The article of manufacture according to claim 9, the substrate comprising an etched portion, wherein the thermal barrier coating is disposed on the etched portion, and wherein the etched portion is formed by a process comprising plasma etching using Plasma Enhanced Magnetron Sputtering (PEMS).

11. The article of manufacture according to claim 9, the substrate comprising an intermix layer, wherein the thermal barrier coating is disposed on the intermix layer, and wherein a plurality of ions from the bond layer are implanted into the intermix layer.

12. The article of manufacture according to claim 9, wherein the substrate is a component of a hypersonic aerospace device.

13. The article of manufacture according to claim 12, wherein the component is a hypersonic missile fin.

14. The thermal barrier coating according to claim 1, wherein hexagonal boron nitride has a thickness in the range of 1-100 nm and provides high-temp oxidation resistance from 1000° C.-1500° C.

15. The thermal barrier coating according to claim 9, wherein hexagonal boron nitride has a thickness in the range of 1-100 nm and provides high-temp oxidation resistance from 1000° C.-1500° C.

* * * * *